(12) United States Patent
Iwami et al.

(10) Patent No.: US 9,645,694 B2
(45) Date of Patent: May 9, 2017

(54) CONDUCTIVE FILM, DISPLAY DEVICE EQUIPPED WITH SAME AND METHOD FOR DETERMINING PATTERN OF CONDUCTIVE FILM

(71) Applicant: FUJIFILM Corporation, Tokyo (JP)

(72) Inventors: Kazuchika Iwami, Kanagawa (JP); Hiroshige Nakamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 49 days.

(21) Appl. No.: 14/742,714

(22) Filed: Jun. 18, 2015

(65) Prior Publication Data
US 2015/0286323 A1    Oct. 8, 2015

Related U.S. Application Data

(63) Continuation of application No. PCT/JP2013/083001, filed on Dec. 9, 2013.

(30) Foreign Application Priority Data

Dec. 18, 2012  (JP) .................................. 2012-276175

(51) Int. Cl.
*G06F 3/045*       (2006.01)
*G06F 3/047*       (2006.01)
(Continued)

(52) U.S. Cl.
CPC .............. *G06F 3/047* (2013.01); *G06F 3/041* (2013.01); *G06F 3/044* (2013.01); *H05K 9/0096* (2013.01);
(Continued)

(58) Field of Classification Search
CPC .......... G06F 3/041; G06F 3/044; G06F 3/047; G06F 2203/04103; G06F 2203/04112; H03K 17/9602; H03K 17/9622
See application file for complete search history.

(56) References Cited

U.S. PATENT DOCUMENTS 8,269,744 B2    9/2012 Agari et al.
2009/0073085 A1*  3/2009 Saneto ................. H05K 9/0096
                                                 345/36
(Continued)

FOREIGN PATENT DOCUMENTS

JP    2009-117683      5/2009
JP    2009-252868     10/2009
(Continued)

OTHER PUBLICATIONS

"English Translation of International Preliminary Report on Patentability; this report contains the following items :Form PCT/IB/373, PCT/ISA237(cover sheet), PCT/ISA237(Box No. 1),PCT/ISA237(Box no. V), PCT/ISA237(Box No. VIII)", mailed on Jul. 2, 2015, pp. 1-pp. 7.

(Continued)

*Primary Examiner* — Joe H Cheng
(74) *Attorney, Agent, or Firm* — Jianq Chyun IP Office

(57) ABSTRACT

The conductive film which can inhibit the occurrence of moire and can greatly improve recognition property, a display device equipped with the conductive film, and a method for determining a pattern of a conductive film are provide. In the conductive film, a spectral intensity of moire of a lowest frequency is equal to or less than −3.6 expressed in terms of common logarithm, and the spectral intensity is represented by convolution of spatial frequency characteristics of the mesh pattern that are obtained at least when the mesh pattern is observed from a front side and spatial frequency characteristics of the pixel array pattern of the display unit that are obtained at least when the pixel array pattern is observed from a front side. The mesh pattern may include a plurality of disconnection portions.

22 Claims, 9 Drawing Sheets

(51) Int. Cl.
*G06F 3/041* (2006.01)
*H05K 9/00* (2006.01)
*G06F 3/044* (2006.01)

(52) U.S. Cl.
CPC .............. *G06F 2203/04103* (2013.01); *G06F 2203/04112* (2013.01)

(56) References Cited

U.S. PATENT DOCUMENTS

| | | | | |
|---|---|---|---|---|
| 2009/0219257 | A1* | 9/2009 | Frey | G06F 3/044 345/173 |
| 2009/0273577 | A1* | 11/2009 | Chen | G06F 3/044 345/174 |
| 2010/0302201 | A1* | 12/2010 | Ritter | G06F 3/044 345/174 |
| 2011/0102370 | A1 | 5/2011 | Kono et al. | |
| 2011/0291966 | A1* | 12/2011 | Takao | G06F 3/044 345/173 |
| 2012/0228110 | A1 | 9/2012 | Takahashi et al. | |
| 2012/0242606 | A1* | 9/2012 | Mackey | G06F 3/044 345/173 |
| 2013/0028503 | A1* | 1/2013 | Wakui | H05K 9/0086 382/141 |
| 2013/0100054 | A1* | 4/2013 | Philipp | G06F 3/044 345/173 |
| 2013/0242485 | A1* | 9/2013 | Ohtani | G06F 3/041 361/679.01 |
| 2013/0294037 | A1* | 11/2013 | Kuriki | H05K 9/00 361/748 |
| 2013/0341070 | A1* | 12/2013 | Kim | H05K 1/0213 174/250 |
| 2014/0152580 | A1* | 6/2014 | Weaver | G06F 3/041 345/173 |
| 2014/0218325 | A1* | 8/2014 | Iwami | B32B 7/02 345/173 |
| 2015/0015979 | A1* | 1/2015 | Iwami | H05K 9/0096 359/893 |
| 2015/0015980 | A1* | 1/2015 | Iwami | H05K 9/0096 359/893 |
| 2015/0177876 | A1* | 6/2015 | Ishii | G06F 3/044 345/174 |
| 2015/0185925 | A1* | 7/2015 | Iwami | G06F 3/044 345/174 |
| 2015/0198972 | A1* | 7/2015 | Iwami | G06F 3/041 345/174 |
| 2015/0342034 | A1* | 11/2015 | Iwami | H05K 1/0274 345/174 |
| 2016/0092012 | A1* | 3/2016 | Yamaguchi | G06F 1/16 345/173 |

FOREIGN PATENT DOCUMENTS

| | | |
|---|---|---|
| JP | 2010-097536 | 4/2010 |
| JP | 2010-262529 | 11/2010 |
| JP | 2012-185770 | 9/2012 |

OTHER PUBLICATIONS

"Office Action of Korea Counterpart Application", issued on Aug. 23, 2016, p. 1-p. 10, with partial English translation thereof.

* cited by examiner

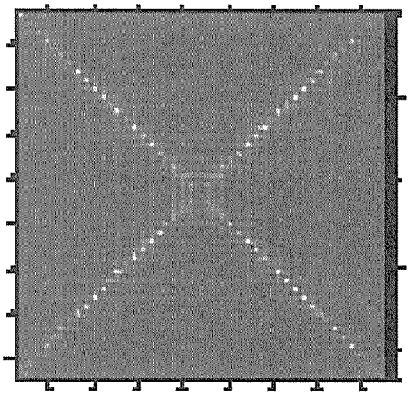
FIG. 12A
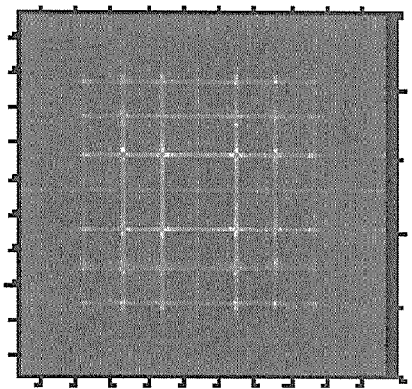
FIG. 12B
FIG. 13
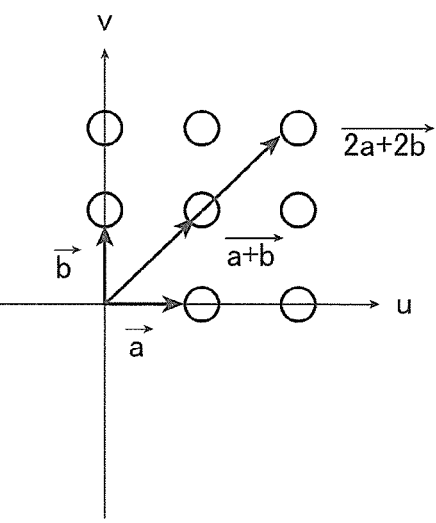
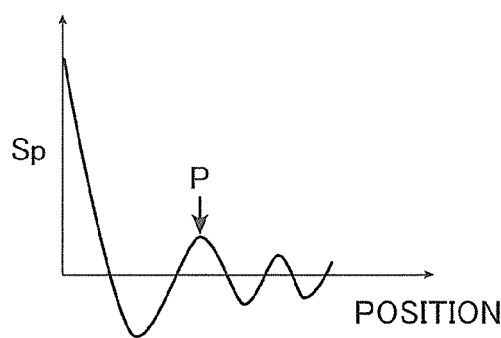
FIG. 14A
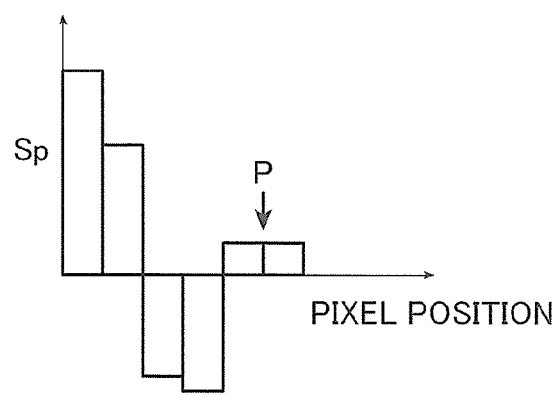
FIG. 14B

CONDUCTIVE FILM, DISPLAY DEVICE EQUIPPED WITH SAME AND METHOD FOR DETERMINING PATTERN OF CONDUCTIVE FILM

CROSS-REFERENCE TO RELATED APPLICATIONS

This application is a Continuation of PCT International Application No. PCT/JP2013/083001 filed on Dec. 9, 2013, which claims priority under 35 U.S.C. §119(a) to Japanese Patent Application No. 2012-276175 filed on Dec. 18, 2012. Each of the above application(s) is hereby expressly incorporated by reference, in its entirety, into the present application.

BACKGROUND OF THE INVENTION

The present invention relates to a conductive film, a display device equipped with the conductive film, and a method for determining a pattern of a conductive film. Specifically, the present invention relates to a conductive film, which is used as a mesh transparent conductive film, and has a mesh pattern designed in consideration of an electrode such that a spectral intensity and a frequency of visually recognized moire are respectively within predetermined ranges of intensity and frequency, a display device equipped with the conductive film, and a method for determining a pattern of a conductive film.

Examples of a conductive film installed on a display unit of a display device (hereinafter, also referred to as a display) include a conductive film for electromagnetic wave-shielding and a conductive film for a touch sensor (touch panel) (for example, see Patent Literatures 1 to 3).

JP 2009-117683 A (Patent Literature 1) filed by the applicant of the present application discloses a conductive film for electromagnetic wave-shielding having an electromagnetic wave-shielding pattern formed of a mesh-like conductive metal thin film, and discloses that a second pattern, which is generated from second pattern data in which the relative distance between spectral peaks of two-dimensional Fourier spectra (2DFFT Sp) of the respective pattern data of a first pattern such as a pixel array pattern (for example, a black matrix (hereinafter, also referred to as BM) pattern) of a display and the second pattern such as the electromagnetic wave-shielding pattern is greater than a predetermined spatial frequency, for example, 8 cm$^{-1}$, is automatically selected.

JP 2009-117683 A also discloses that when the relative distance is not greater than the predetermined spatial frequency, changing of one or more of a rotation angle, a pitch, and a pattern width of the second pattern data to generate new second pattern data is repeated until the relative distance is greater than the predetermined spatial frequency.

In this way, in JP 2009-117683 A, it is possible to automatically select an electromagnetic wave-shielding pattern that can suppress the occurrence of moire and that can avoid an increase in surface resistivity or degradation in transparency.

Meanwhile, in a conductive film for a touch panel, in view of quick responsiveness, high resolution, increase in size, low production cost, and the like, instead of the conventional transparent ITO (indium tin oxide), opaque conductive materials such as metals are used as mesh-like wiring materials. In order to realize a touch panel by using such a conductive film, the conductive film needs to have resolution for detecting a touched position. For making the conductive film function as a transparent conductive film such as ITO by using mesh-like conductive wiring of the conductive film, with respect to the whole surface of solid mesh-like wiring, cut portions need to be provided in specific mesh-like wiring so as to form disconnections, and in this way, a wiring region for detection corresponding to the aforementioned resolution needs to be separated from a dummy wiring region that does not contribute to the detection.

In the touch panel disclosed in JP 2010-097536 A (Patent Literature 2), within each of a plurality of dummy wiring regions surrounded by 2 types of wiring for detection made of a metal (an opaque conductive material) that are provided to cross each other via an insulating layer on both sides thereof, isolated wiring is arranged in a state of being parallel or perpendicular to the wiring for detection or in a state of inclining by 45° with respect to the wiring for detection. In this way, cut portions (breaks) are formed between a wiring region for detection composed of 2 types of wiring for detection and a dummy wiring region, and consequently, the wiring region for detection and the dummy wiring region are separated from each other.

According to JP 2010-097536 A, in this way, it is possible to obtain a touch panel which has a high response speed, can reduce display unevenness or moire, has high visibility, and is easily made into a large-sized touch panel.

JP 2010-262529 A (Patent Literature 3) discloses a conductive film (planar body) for a capacitive type touch panel (a touch switch). The conductive film is divided into a plurality of regions of a conductive portion, in which network (mesh)-like electrodes composed of conductive wires are disposed at a predetermined interval in a state of being approximately parallel to each other, and regions of a non-conductive portion each of which is disposed between the regions of a conductive portion. The regions of a non-conductive portion include a plurality of cut portions (breaks) that cut the conductive wires in the form of islands, and by the cut portions, the regions of a non-conductive portion (dummy wiring regions) can be insulated from the regions of a conductive portion (wiring regions for detection) adjacent thereto.

According to JP 2010-262529 A, in this way, it is possible to improve visibility by preventing the visibility from deteriorating due to the occurrence of variation of mesh density (deviation of mesh), and to provide a planar body and a touch switch that can be efficiently manufactured.

SUMMARY OF THE INVENTION

JP 2009-117683 A discloses the technique of controlling a moire frequency using only frequency information of a black matrix (BM) pattern/a wiring pattern of a display in generating a wiring pattern of the conductive film and providing a wiring pattern having excellent-moire recognition property, but the determination of whether moire is visually recognized or not depends on only the frequency. Since human perception of moire is affected by intensity as well as frequency, even at a frequency at which moire is not visually recognized in the technique of JP 2009-117683 A, moire may be visually recognized depending on the intensity, and thus there is a problem in that the moire recognition property is not improved satisfactorily.

Particularly, when the technique disclosed in JP 2009-117683 A is applied to a conductive film for a touch panel, it is necessary to provide a plurality of cut portions (breaks) in the mesh-like conductive wiring, and if the cut portions are provided, there is a problem in that the spatial frequency characteristics of the wiring pattern of the mesh-like conductive wiring vary. In addition, since the conductive film is pressed with a human finger, a minute distortion occurs between the BM/wiring patterns, and thus there is a problem in that visual recognition of moire due to intensity is promoted. Accordingly, when the technique disclosed in JP 2009-117683 A is applied to a conductive film for a touch panel, there is a problem in that the improvement in moire recognition property is not satisfactory.

Therefore, in order to design a pattern having excellent moire recognition property, it is important to design the pattern in consideration of the cut portions (breaks). However, in the conventional technique, such a point has not been discussed.

Furthermore, in JP 2010-097536 A, within each of the plurality of dummy wiring regions surrounded by wiring regions for detection composed of 2 types of wiring for detection, the isolated wiring is arranged in a state of being parallel or perpendicular to the wiring for detection or in a state of inclining by 45° with respect to the wiring for detection. Therefore, the disconnections formed by the cut portions between the 2 types of wiring for detection and the isolated wiring are regularly provided. Consequently, the regular period of the disconnections exerts an influence on the visually recognized moire, and this leads to a problem in that the moire recognition property cannot be sufficiently improved.

Moreover, in JP 2010-262529 A, in order to insulate the regions of a conductive portion from the regions of a non-conducive portion, a plurality of cut portions cutting the conductive wires of the mesh-like electrodes is provided in a portion in which the conductive wires of the mesh-like electrodes cross each other. Therefore, in the mesh-like electrodes, the cut portions are basically regularly provided. Consequently, the regular period of the disconnections exerts an influence on the visually recognized moire, and this leads to a problem in that the moire recognition property cannot be sufficiently improved.

Particularly, for increasing the size of a touch panel, opaque conductive materials such as metals need to be used. However, because a predetermined or a high level of resolution is required, the moire recognition property becomes a serious problem.

In the specification of Japanese Patent Application No. 2012-082711, the present applicant calculated spatial frequency peaks of BM (pixel matrix) of a display and spatial frequency peaks of a wiring pattern (mesh pattern) of mesh-like wiring of a conductive film, calculated evaluation values by convolution of a two-dimensional frequency and spectral intensity of moire, that are obtained as a difference between the respective spatial frequency peaks and an integrated value of peak intensities, and a visual transfer function, and suggested a conductive film having a wiring pattern in which the evaluation values satisfy predetermined conditions.

When such a conductive film is used in a touch panel, as the aforementioned conductive films for a touch panel of the conventional technique that are described in Patent Literatures 2 and 3 and the like, a plurality of disconnections needs to be added to the conductive film by providing a plurality of disconnection portions (cut portions: breaks) in the mesh-like wiring that separates the wiring regions for detection securing the resolution of the mesh-like wiring from the dummy wiring regions. Generally, these disconnection portions are regularly added to the conductive film, for the purpose of satisfying specific resolution required for a touch panel as in the aforementioned conventional techniques or for the purpose of making the capacitance of the region of resolution constant. However, the conductive film has a problem in that the moire is visually recognized due to the regular period of the disconnections. In this manner, the regular period of the disconnections exerts an influence on the visually recognized moire, and this leads to a problem in that the moire recognition property cannot be sufficiently improved. However, such a problem has not been discussed in any of the technique suggested by the present applicant and the aforementioned conventional techniques.

An object of the present invention is to solve the problems of the aforementioned conventional techniques and to provide a conductive film, which can inhibit the occurrence of moire and can greatly improve recognition property, a display device equipped with the conductive film, and a method for determining a pattern of a conductive film.

Particularly, in a case in which a conductive film installed on a display unit of a display device has a plurality of disconnection portions in mesh-like wiring having a mesh pattern composed of thin metal wires, moire occurs. Accordingly, another object of the present invention is to provide a conductive film, which can inhibit the occurrence of moire and greatly improve the recognition property even in such a case, a display device equipped with the conductive film, and a method for determining a pattern of a conductive film.

Furthermore, particularly, in a case in which a transparent conductive film having mesh-like wiring including a plurality of disconnection portions is used as an electrode for a touch panel that needs to be made into a large-sized touch panel and to have higher resolution, when the conductive film is superimposed on a black matrix of a display unit of the display device and visually recognized, moire occurs, and thus greatly impairs image quality. Accordingly, the other object of the present invention is to provide a conductive film, which can inhibit the occurrence of moire and can greatly improve the visibility of display on the touch panel even in such a case, a display device equipped with the conductive film, and a method for determining a pattern of a conductive film.

In order to achieve the above objects, the present inventors repeated intensive research regarding a mesh pattern of a conductive film that prevents moire from being visually recognized even when it is superimposed on a black matrix of a display unit. As a result, they found that the reason why the moire is visually recognized due to the breaks having a regular period in the conductive films according to the conventional techniques and the prior application filed by the present applicant can be explained by a difference in spatial frequency characteristics between a case in which the conductive film has only a mesh pattern (without breaks) and a case in which the conductive film has a mesh pattern (with breaks) including breaks having a regular period as shown in FIGS. 17A and 17B.

Herein, FIG. 17A is a view showing spatial frequency characteristics in a case of a mesh pattern (without breaks) in which no break (disconnection portion) is present and the moire recognition property has been optimized, and FIG. 17B is a view showing the spatial frequency characteristics in a case of a mesh pattern (with breaks) including breaks having a regular period. As is evident from FIGS. 17A and 17B, in the mesh pattern including breaks having a regular period, the number of spectral peaks has increased, but the spectral intensity of the increased spectral peaks is not so high.

In this way, from FIGS. 17A and 17B, the present inventors found that depending on the presence or absence of breaks, the spatial frequency characteristics of the mesh pattern change, and the change exerts an influence on the moire recognition property. As a result, they obtained knowledge that in order to design a pattern having excellent moire recognition property, it is important to design the pattern in consideration of the breaks. Based on the knowledge, the present inventors accomplished the present invention.

That is, the conductive film according to the first aspect of the present invention is a conductive film installed on a display unit of a display device, comprising: a transparent substrate; and mesh-like wiring which is formed on at least one surface of the transparent substrate and has a mesh pattern formed of a plurality of patterned thin metal wires, wherein the mesh pattern of the mesh-like wiring is superimposed on a pixel array pattern of the display unit, a spectral intensity of moire of a lowest frequency is equal to or less than −3.6 expressed in terms of common logarithm, and the spectral intensity of the moire of the lowest frequency is represented by convolution of spatial frequency characteristics of the mesh pattern that are obtained at least when the mesh pattern is observed from a front side and spatial frequency characteristics of the pixel array pattern of the display unit that are obtained at least when the pixel array pattern is observed from a front side.

Preferably, the mesh-like wiring has an electrode portion, which includes an electrode wiring pattern formed of the plurality of thin metal wires in a form of a continuous mesh, and a non-electrode portion, which is formed of the plurality of thin metal wires in a form of a mesh, has a plurality of disconnection portions, includes a discontinuous non-electrode wiring pattern, and is insulated from the electrode portion, the mesh pattern of the mesh-like wiring is constituted with the electrode wiring pattern of the electrode portion and the non-electrode wiring pattern of the non-electrode portion insulated from the electrode wiring pattern, and the spatial frequency characteristics of the mesh pattern are spatial frequency characteristics of the mesh pattern including the plurality of disconnection portions that are obtained at least when the mesh pattern is observed from the front side.

In order to achieve the above objects, the method for determining a wiring pattern of a conductive film according to the second aspect of the present invention is a method for determining a mesh pattern of a conductive film which is installed on a display unit of a display device and in which mesh-like wiring having a mesh pattern formed of a plurality of patterned thin metal wires in a form of a continuous mesh has been formed, the method comprising the steps of: obtaining transmittance period image data of the mesh pattern and transmittance period image data of a pixel wiring pattern of the display unit on which the mesh pattern is superimposed; performing two-dimensional Fourier transform on the obtained transmittance period image data of the mesh pattern and on the obtained transmittance period image data of the pixel array pattern to obtain spatial frequency characteristics of the mesh pattern and spatial frequency characteristics of the pixel array pattern, the spatial frequency characteristics of the mesh pattern and the pixel array pattern being obtained at least when the mesh pattern and the pixel array pattern are observed from a front side; calculating frequencies and spectral intensities of moires represented by convolution of the spatial frequency characteristics of the mesh pattern and the spatial frequency characteristics of the pixel array pattern, from the obtained spatial frequency characteristics of the mesh pattern and the pixel array pattern; determining a lowest frequency among the calculated frequencies of the moires, and comparing the spectral intensity of the moire of the lowest frequency with −3.6 expressed in terms of a common logarithm; and setting the mesh pattern to be a mesh pattern of the conductive film when the spectral intensity of the moire of the lowest frequency defined by the common logarithm is equal to or less than −3.6, and when the spectral intensity of the moire of the lowest frequency is greater than −3.6, updating the transmittance period image data of the mesh pattern to transmittance period image data of a new mesh pattern, and repeating the respective steps of obtaining spatial frequency characteristics, calculating frequencies and spectral intensities of moires, and comparing the spectral intensity of the moire of the lowest frequency with −3.6 until the spectral intensity of the moire of the lowest frequency becomes equal to or less than −3.6.

Preferably, the mesh-like wiring has the mesh pattern including an electrode wiring pattern, which is formed of the plurality of thin metal wires in the form of a continuous mesh, and a non-electrode wiring pattern, which is formed of the plurality of thin metal wires in the form of a mesh, has a plurality of disconnection portions, and is discontinuous to and insulated from the electrode wiring pattern, the transmittance period image data of the mesh pattern is transmittance period image data of the mesh pattern including the non-electrode wiring pattern having the plurality of disconnection portions, and the spatial frequency characteristics of the mesh pattern is spatial frequency characteristics of the mesh pattern including the plurality of disconnection portions that are obtained at least when the mesh pattern is observed from a front side.

Preferably, based on the obtained spatial frequency characteristics of the mesh pattern, spectral peaks of which the peak intensity is equal to or greater than −4.5 expressed in terms of a common logarithm are extracted from a plurality of spectral peaks of two-dimensional Fourier spectra of the transmittance period image data of the mesh pattern, and peak frequencies and peak intensities of all of the extracted spectral peaks are calculated; based on the obtained spatial frequency characteristics of the pixel array pattern, spectral peaks of which the peak intensity is equal to or greater than −4.5 expressed in terms of a common logarithm are extracted from a plurality of spectral peaks of two-dimensional Fourier spectra of the transmittance period image data of the pixel array pattern, and peak frequencies and peak intensities of all of the extracted spectral peaks are calculated; and the frequencies and the spectral intensities of the moires are calculated from the peak frequencies and the peak intensities of the mesh pattern calculated as above and from the peak frequencies and the peak intensities of the pixel array pattern calculated as above.

In the first aspect, preferably, a frequency of the moire is given as a difference between a peak frequency of a spectral peak of the spatial frequency characteristics of the mesh pattern and a peak frequency of a spectral peak of the spatial frequency characteristics of the pixel array pattern, and a spectral intensity of the moire is given as a product of a peak intensity of the spectral peak of the mesh pattern and a peak intensity of the spectral peak of the pixel array pattern.

In the second aspect, preferably, as the frequency of the moire, a difference between the peak frequency of the mesh pattern and the peak frequency of the pixel array pattern is calculated, and as the spectral intensity of the moire, a product of two pairs of vector intensities including the peak intensity of the mesh pattern and the peak intensity of the pixel array pattern is calculated.

And, in the first and second aspects, preferably, the peak intensity is a sum of intensities in a plurality of pixels in a vicinity of the peak position, and each peak intensity is standardized by using transmittance period image data of each of the mesh pattern and the pixel array pattern.

In order to achieve the above objects, the conductive film according to the third aspect of the present invention is a conductive film installed on a display unit of a display device, comprising: a transparent substrate; and mesh-like wiring which is formed on at least one surface of the transparent substrate and has a mesh pattern formed of a plurality of patterned thin metal wires on one surface thereof, wherein the mesh-like wiring has an electrode portion, which includes an electrode wiring pattern formed of the plurality of thin metal wires in a form of a continuous mesh, and a non-electrode portion, which is formed of the plurality of thin metal wires in a form of a mesh, has a plurality of disconnection portions, includes a discontinuous non-electrode wiring pattern, and is insulated from the electrode portion, the mesh pattern of the mesh-like wiring is constituted with the electrode wiring pattern of the electrode portion and the non-electrode wiring pattern of the non-electrode portion insulated from the electrode wiring pattern, and is superimposed on a pixel array pattern of the display unit, when the plurality of disconnection portions of the non-electrode wiring pattern of the non-electrode portion is connected to each other, the mesh pattern of the mesh-like wiring prevents moire from being visually recognized, and the non-electrode wiring pattern of the non-electrode portion is a random wiring pattern in which the plurality of disconnection portions have been randomly arranged.

In the first, second and third aspects, preferably, a frequency of the moire is equal to or less than 3 cycles/mm.

Preferably, the non-electrode wiring pattern of the non-electrode portion is formed of the plurality of thin metal wires in a form of a mesh within a region excluding the electrode portion.

And, preferably, the pixel array pattern is a black matrix pattern.

In order to achieve the above objects, a display device according to the fourth aspect of the present invention comprises: a display unit; and the conductive film according to the first and third aspect that is installed on the display unit.

In order to achieve the above objects, a touch panel display device according to the fifth aspect of the present invention comprises: the display device according to the fourth aspect; and a transparent substrate which is disposed on an upper side of the conductive film of the display device and has a touch surface on the side opposite to the conductive film.

Being constituted as above according to the present invention, it is possible to inhibit the occurrence of moire and to greatly improve visibility, even in a case in which a conductive film installed on a display unit of a display device has a plurality of disconnection portions in mesh-like wiring having a mesh pattern composed of thin metal wires.

Particularly, even in a case in which a transparent conductive film having mesh-like wiring including a plurality of disconnection portions is used as an electrode for a touch panel that needs to be made into a large-sized touch panel and to have higher resolution, according to the present invention, it is possible to inhibit the occurrence of moire that greatly impairs image quality and to greatly improve the visibility of display on the touch panel, when the conductive film is superimposed on a black matrix of a display unit of the display device and visually recognized.

BRIEF DESCRIPTION OF THE DRAWINGS

FIG. 12A is a view showing the intensity characteristics of two-dimensional Fourier spectra of transmittance period image data of the pixel array pattern shown in FIG. 11A, and FIG. 12B is a view showing the intensity characteristics of two-dimensional Fourier spectra of transmittance period image data of the wiring pattern shown in FIG. 11B.

FIG. 13 is a graph showing peak frequency positions of the pixel array pattern of the display unit shown in FIG. 11A.

FIG. 14A is a graph showing an example of the intensity characteristics of the two-dimensional Fourier spectra by using a curve, and FIG. 14B is a bar graph showing an example of the intensity characteristics of the two-dimensional Fourier spectra by using bars.

DETAILED DESCRIPTION OF THE INVENTION

Hereinafter, a conductive film and a method for determining a pattern of the conductive film according to the present invention will be described in detail with reference to preferred embodiments illustrated in the accompanying drawings.

In the following description, a conductive film for a touch panel which has disconnection portions in mesh-like wiring will be explained as a representative example of the conductive film according to the present invention. However, the present invention is not limited to this example as long as it is a conductive film installed on a display unit of a display device such as a liquid crystal display (LCD), a plasma display panel (PDP), an organic electroluminescence display (OELD), an inorganic EL display, or the like, and it is needless to say that as long as the conductive film has the disconnection portions in the mesh-like wiring, it may be, for example, a conductive film for electromagnetic wave-shielding, or the like.

Figure 1:
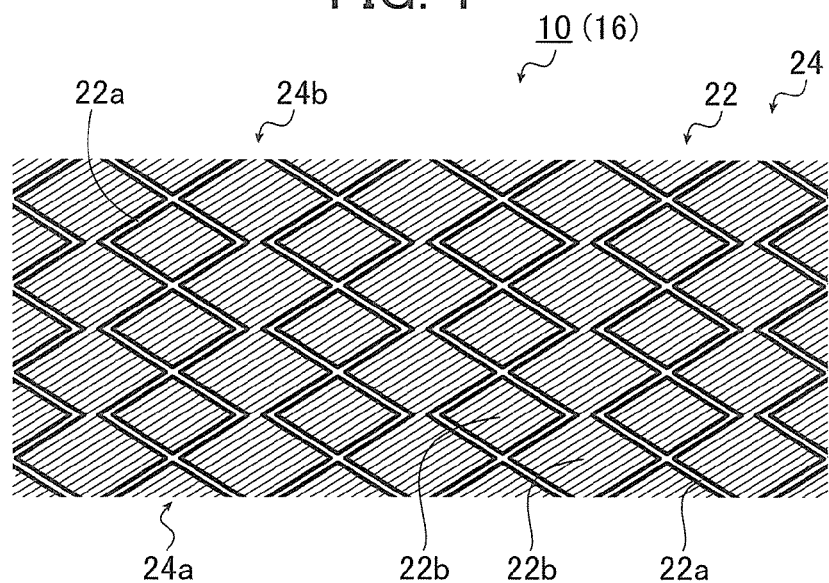
FIG. 1 is a plan view schematically showing an example of a conductive film according to a first embodiment of the present invention.
Figure 2:
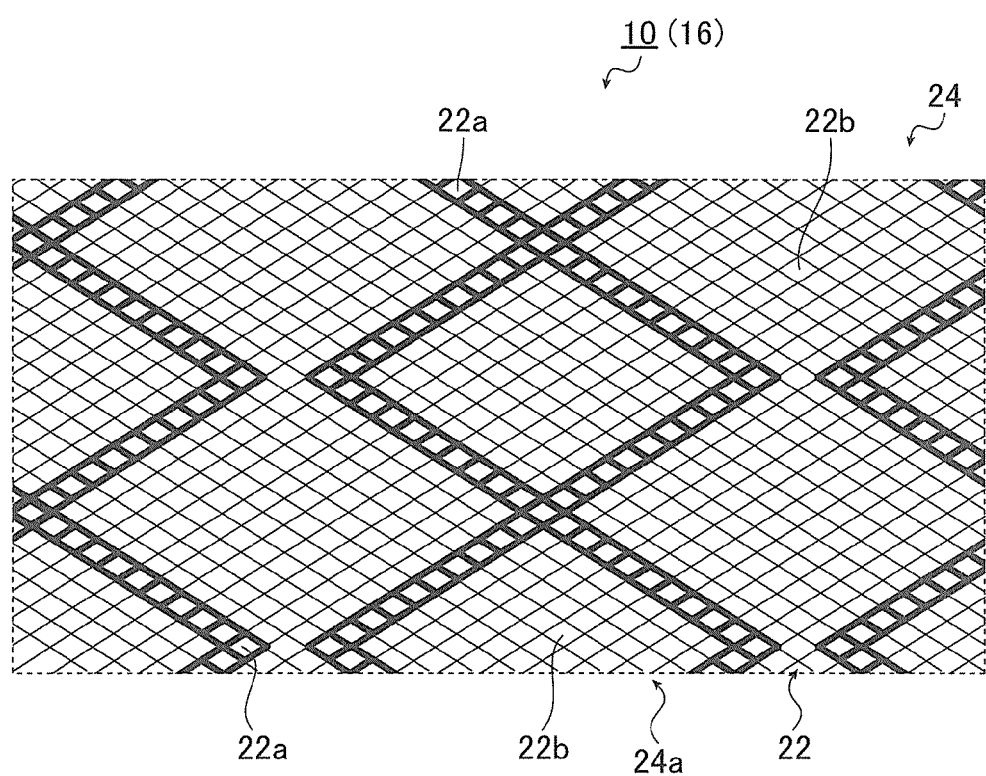
FIG. 2 is a partially enlarged plan view of the conductive film shown in FIG. 1.
Figure 3:
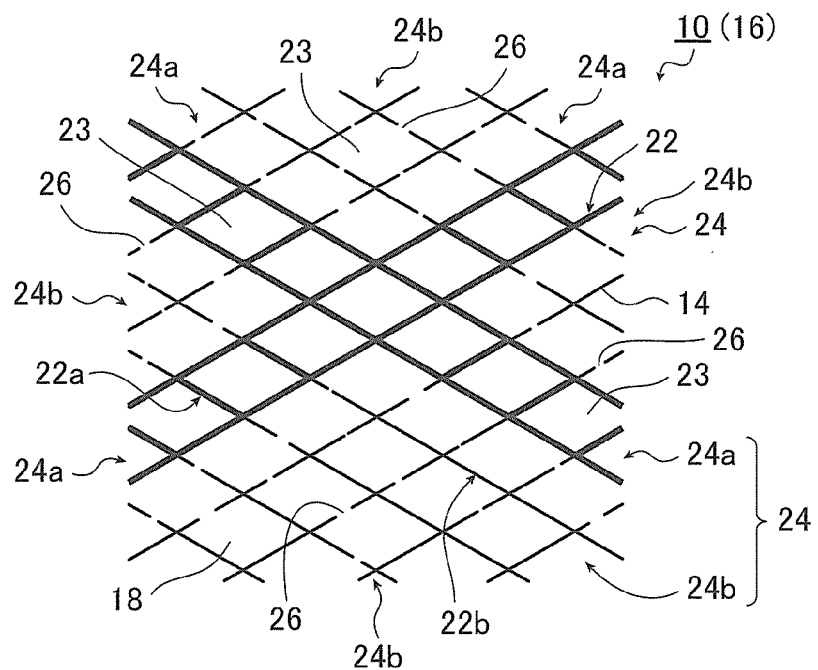
FIG. 3 is a partially enlarged plan view of the conductive film shown in FIG. 2, schematically showing an example of a plurality of disconnection portions of a mesh pattern thereof.
Figure 4:
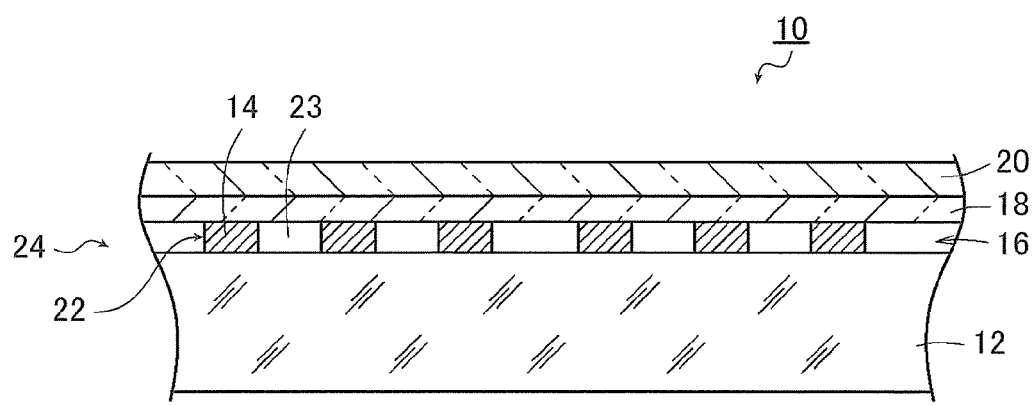
FIG. 4 is a schematic partial cross-sectional view of the conductive film shown in FIG. 3.

FIG. 1 is a plan view schematically showing an example of the entirety of a conductive film according to a first embodiment of the present invention, FIG. 2 is a partially enlarged plan view of the conductive film, and FIG. 3 is a partially enlarged plan view schematically showing an example of a plurality of disconnection portions of a mesh pattern of the conductive film. FIG. 4 is a schematic partial cross-sectional view of the conductive film shown in FIG. 3. In FIG. 1, for better understanding, an electrode portion of the mesh-like wiring of the conductive film is indicated as a region surrounded by thick lines, and a dummy electrode portion is indicated as a region of diagonal lines. Furthermore, in FIGS. 2 and 3, for better understanding, within the mesh pattern of the mesh-like wiring of the conductive film, an electrode wiring pattern is indicated by thick lines, and a dummy electrode pattern is indicated by thin lines. However, needless to say, the patterns are formed of the same opaque thin metal wires, and there is no difference in the thickness between the patterns.

As shown in the drawings, a conductive film 10 according to this embodiment is installed on a display unit of a display device and is a conductive film having the mesh pattern (wiring pattern) that is excellent in suppression of occurrence of moire with respect to a black matrix (BM) of the display unit, particularly, a conductive film in which the mesh-like wiring having the mesh pattern is formed, and the mesh pattern is optimized in terms of moire recognition property with respect to the BM pattern when the conductive film is superimposed on the BM pattern. The conductive film 10 includes a transparent substrate 12, a wiring layer 16 that is formed on approximately the whole surface of the transparent substrate 10 (on the upper surface in FIG. 4) and that is formed of a plurality of patterned opaque thin wires made of metal (hereinafter, referred to as thin metal wires) 14, and a protective layer 20 bonded to approximately the whole surface of the wiring layer 16 through an adhesive layer 18 so as to cover the thin metal wires 14.

The transparent substrate 12 is formed of a material having an insulating property and having a high translucency, and examples thereof include a resin, a glass, and silicon. Examples of the resin include Polyethylene Terephthalate (PET), Polymethyl methacrylate (PMMA), polypropylene (PP), polystyrene (PS), and the like.

The wiring layer 16 includes mesh-like wiring 22 formed of the plurality of thin metal wires 14. The thin metal wire 14 is not particularly limited as long as it is a thin wire made of metal having high conductivity, and examples of the thin metal wire include a thin wire made of gold (Au), silver (Ag), copper (Cu), or the like. The line width of the thin metal wire 14 is preferably small in terms of recognition property, and can be, for example, less than or equal to 30 μm. For application to a touch panel, the line width of the thin metal wires 14 preferably ranges from 0.1 μm to 15 μm, more preferably ranges from 1 μm to 9 μm, and even more preferably ranges from 2 μm to 7 μm.

Specifically, the mesh-like wiring 22 has a wiring pattern in which the plurality of thin metal wires 14 in two directions has been wired so as to cross each other. That is, the mesh-like wiring 22 has a mesh pattern 24 in which the plurality of thin metal wires 14 have been arranged in the form of a mesh. In the illustrated example, the mesh shape of an opening 23 formed by the mesh pattern 24 is a rhombic and can be referred to as a diamond pattern, but the present invention is not limited thereto. Any polygonal shape having at least three sides may be employed as long as it can constitute the mesh pattern 24 optimized in terms of moire recognition property with respect to a predetermined BM pattern which will be described later. The mesh shapes may be the same as or different from each other, and examples thereof include polygons that are the same as or different from each other, such as triangles, for example, a regular triangle and an equilateral triangle, quadrangles (rectangles), for example, a square and rectangles, pentagons, and hexagons. That is, as long as it is a mesh pattern optimized in terms of moire recognition property with respect to the BM pattern, a mesh pattern formed by the arrangement of openings 23 having regularity or a mesh pattern randomized by the arrangement of openings 23 having different shapes may be employed.

The mesh-like wiring 22 has an electrode portion 22a, which includes an electrode wiring pattern 24a formed of the plurality of thin metal wires 14 in the form of a continuous mesh, and a dummy electrode portion (non-electrode portion) 22b, which is also formed of the plurality of thin metal wires in the form of a mesh, has a plurality of disconnection portions 26 and a discontinuous dummy electrode (non-electrode) wiring pattern 24b, and is insulated from the electrode portion 22a. In the example shown in the drawings, the electrode wiring pattern 24a of the electrode portion 22a and the dummy electrode wiring pattern 24b of the dummy electrode portion 22b are wiring patterns having the same mesh shape (rhomboid). By the synthesis of the electrode wiring pattern 24a and the dummy electrode wiring pattern 24b, the mesh pattern 24 of the mesh-like wiring 22 is formed.

Herein, the electrode wiring pattern 24a of the electrode portion 22a shown in the drawings is an electrode pattern constituting an X electrode. However, the present invention is not limited to such a constitution. The electrode wiring pattern 24a may be any of the conventionally known electrode patterns such as a stripe electrode, a bar-and-stripe electrode, a diamond electrode, and a snowflake electrode, as long as it is an electrode pattern used in a capacitive type touch sensor (panel).

The thin metal wires 14 formed in the form of a mesh in the electrode portion 22a do not have the disconnection portions 26 and are continuous to each other. In contrast, in the thin metal wires 14 formed in the form of a mesh in the dummy electrode portion 22b, the plurality of disconnection portions (cut portions) 26 has been formed, and a plurality of disconnections has been added thereto. Between the thin metal wire 14 in the electrode portion 22a and the thin metal wire 14 in the dummy electrode portion 22b, the disconnection portion 26 is provided without exception. Therefore, the thin metal wire 14 of the electrode portion 22a and the thin metal wire 14 of the dummy electrode portion 22b are disconnected from each other and in a discontinuous state.

That is, the dummy electrode portion 22b and the electrode portion 22a are electrically insulated from each other.

As described above, the mesh pattern 24 of the mesh-like wiring 22 is a mesh pattern including the plurality of disconnection portions 26. The constitution necessary for the mesh pattern 24 of the mesh-like wiring 22 of the conductive film 10 of the present invention will be described later.

As materials of the adhesive layer 18, a wet laminate adhesive, a dry laminate adhesive, a hot melt adhesive, or the like can be mentioned.

Similarly to the transparent substrate 12, the protective layer 20 is formed of a material having a high translucency, such as a resin, a glass, and silicon. The refractive index n1 of the protective layer 20 is preferably a value that is equal to or close to the refractive index n0 of the transparent substrate 12. In this case, the relative refractive index nr1 of the transparent substrate 12 with respect to the protective layer 20 becomes a value close to 1.

Herein, the refractive index in this specification means a refractive index for light with a wavelength of 589.3 nm (D line of sodium). For example, in regard to resins, the refractive index is defined by ISO 14782: 1999 (corresponding to JIS K 7105) that is an international standard. In addition, the relative refractive index nr1 of the transparent substrate 12 with respect to the protective layer 20 is defined as $nr1=(n1/n0)$. Herein, it is preferable that the relative refractive index nr1 is in a range of 0.86 or more and 1.15 or less, and a range of 0.91 or more and 1.08 or less is more preferable.

By limiting the relative refractive index nr1 to this range and controlling light transmittance between members of the transparent substrate 12 and the protective layer 20, it is possible to further improve moire recognition property.

The conductive film 10 according to the first embodiment described above has the wiring layer 16 only on one surface of the transparent substrate 12, but the present invention is not limited to this configuration, and the conductive film 10 may have a wiring portion on both surfaces of the transparent substrate 12.

Figure 5:
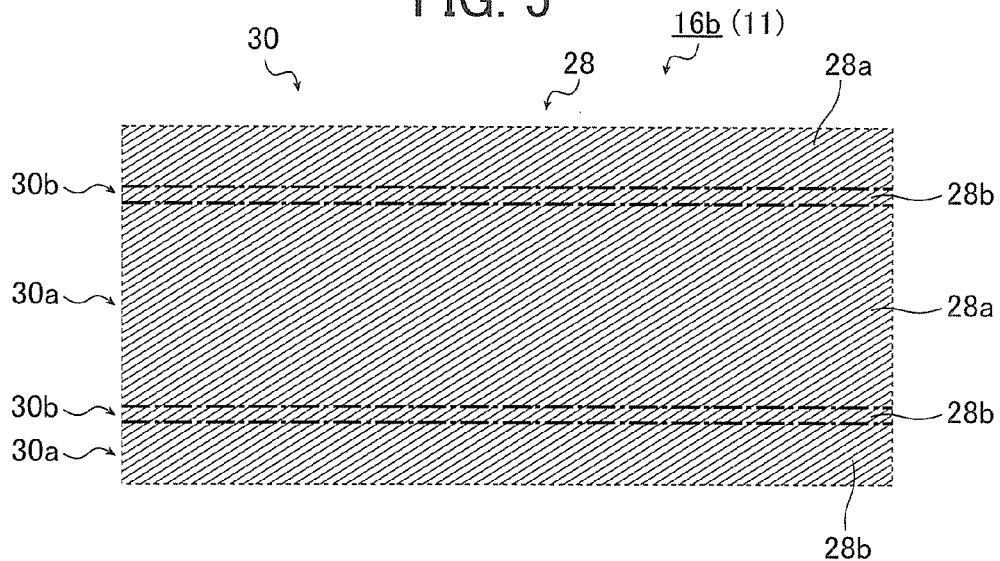
FIG. 5 is a plan view schematically showing an example of a wiring layer on one side of a conductive film according to a second embodiment of the present invention.
Figure 6:
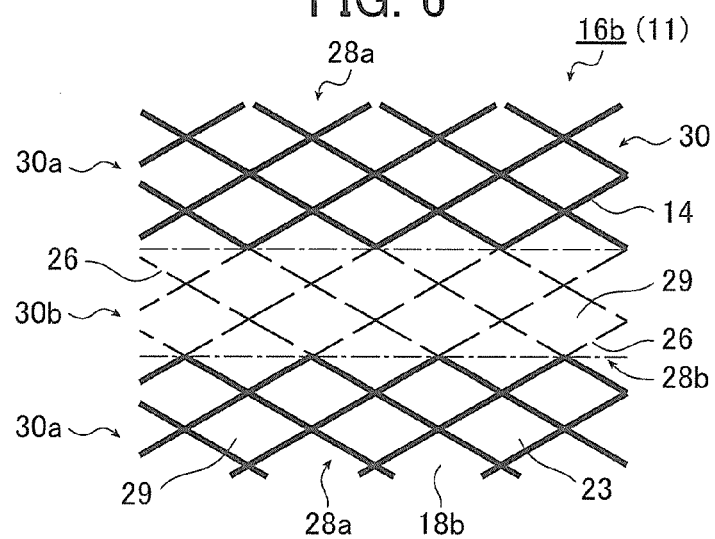
FIG. 6 is a partially enlarged plan view of the wiring layer of the conductive film shown in FIG. 5, schematically showing an example of a plurality of disconnection portions of a mesh pattern thereof.
Figure 7:
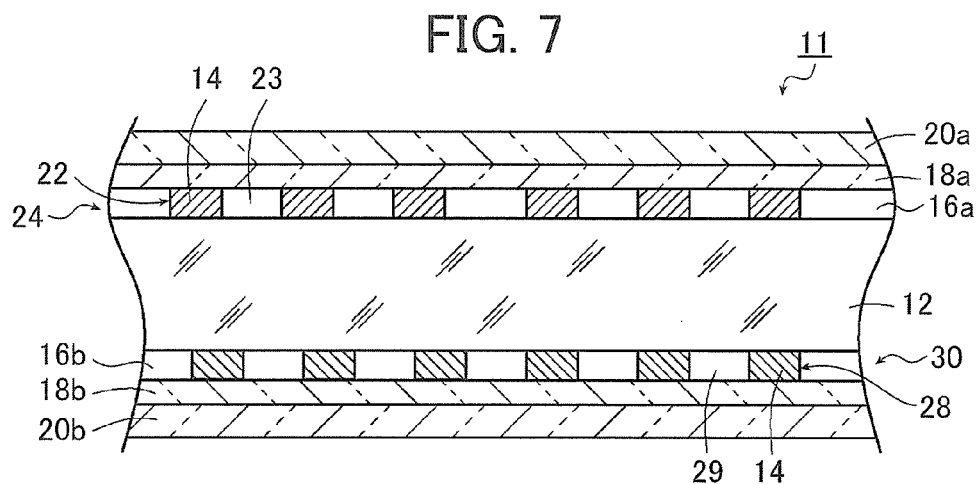
FIG. 7 is a schematic partial cross-sectional view of the conductive film shown in FIG. 6.

FIG. 5 is a plan view schematically showing an example of one side of a conductive film according to a second embodiment of the present invention, that is, an example of a second wiring layer on the lower side. FIG. 6 is a partially enlarged plan view of the second wiring layer, schematically showing an example of a plurality of disconnection portions of the mesh pattern. FIG. 7 is a schematic partial cross-sectional view of the conductive film shown in FIG. 6. In FIG. 5, for better understanding, an electrode portion of the mesh-like wiring of the conductive film is indicated as a region of diagonal lines, and a dummy electrode portion is indicated as a region surrounded by dot-and-dash lines. Furthermore, in FIG. 6, for better understanding, within a mesh pattern of the mesh-like wiring of the conductive film, an electrode wiring pattern is indicated by thick lines, and a dummy electrode pattern is indicated by thin lines. However, needless to say, these patterns are formed of the same opaque thin metal wires, and there is no difference in the thickness between the patterns.

Herein, the plan view of the other side of the conductive film of the second embodiment shown in FIG. 7, that is, the plan view of a first wiring layer on the upper side is the same as the plan view of the conductive film of the first embodiment of the present invention shown in FIGS. 1 to 3. Therefore, the plan view of the first wiring layer on the upper side will not be described herein.

As shown in FIG. 7, a conductive film 11 of the second embodiment of the present invention has a first wiring layer 16a formed on one surface (the upper side in FIG. 7) of a transparent substrate 12, a second wiring layer 16b formed on the other surface (the lower side of FIG. 7) of the transparent substrate 12, a first protective layer 20a bonded to approximately the whole surface of the first wiring layer 16a through a first adhesive layer 18a, and a second protective layer 20b bonded to approximately the whole surface of the second wiring layer 16b through a second adhesive layer 18b.

As described above, the transparent substrate 12 is formed of an insulating material, and the second wiring layer 16b and the first wiring layer 16a are electrically insulated from each other. Furthermore, each of the first and second wiring layers 16a and 16b can be formed of the same materials and can be formed in the same manner as the wiring layer 16 of the conductive film 10 shown in FIG. 4.

Similarly to the wiring layer 16 shown in FIGS. 1 to 3, the first wiring layer 16a of the conductive film 11 of the present embodiment includes the mesh-like wiring 22 having the electrode portion 22a, which is formed of the plurality of thin metal wires 14 and includes the electrode wiring pattern 24a, and the dummy electrode portion 22b, which includes the dummy electrode wiring pattern 24b having the plurality of disconnection portions 26, and the mesh pattern 24 which is a synthetic pattern of the electrode wiring pattern 24a and the dummy electrode wiring pattern 24b, although such a constitution is not shown in the drawing.

Herein, the first wiring layer 16a of the conductive film 11 has the same constitution as the wiring layer 16 of the conductive film 10 shown in FIGS. 1 to 4. Therefore, the details thereof will not be described herein.

In the conductive film 11, the second wiring layer 16b is formed of the plurality of opaque thin metal wires 14 and has been formed on the other surface (the lower side in FIG. 7) of the transparent substrate 12.

As shown in FIGS. 5 and 6, the second wiring layer 16b includes mesh-like wiring 28 formed of the plurality of thin metal wires 14.

Specifically, similarly to the mesh-like wiring 22 shown in FIGS. 1 to 3, the mesh-like wiring 28 has a wiring pattern in which the plurality of thin metal wires 14 in two directions has been wired so as to cross each other. That is, the mesh-like wiring 28 has a mesh pattern 30 in which the plurality of thin metal wires 14 has been arranged in the form of a mesh. In the example shown in the drawings, the mesh shape of an opening 29 formed by the mesh pattern 30 is rhombic and can be referred to as a diamond pattern. The opening 29 of the mesh pattern 30 of the mesh-like wiring 28 has the same mesh shape as an opening 23 of the mesh pattern 24 of the mesh-like wiring 22 shown in FIGS. 1 to 3. Therefore, the details thereof will not be described herein.

The mesh-like wiring 28 has an electrode portion 28a, which includes an electrode wiring pattern 30a formed of the plurality of thin metal wires 14 in the form of a continuous mesh, and a dummy electrode portion 28b, which is also formed of the plurality of thin metal wires, has the plurality of disconnection portions 26, includes the discontinuous dummy electrode wiring pattern 30b, and is insulated from the electrode portion 28a. Herein, in the example shown in the drawings, the electrode wiring pattern 30a of the electrode portion 28a and the dummy electrode wiring pattern 30b of the dummy electrode portion 28b are wiring patterns having the same mesh shape (rhomboid), and by the synthesis of the electrode wiring pattern 30a and the dummy electrode wiring pattern 30b, the mesh pattern 30 of the mesh-like wiring 28 is formed.

Herein, in the example shown in the drawings, the dummy electrode wiring pattern 30b of the dummy electrode portion 28b has a line shape, and the electrode wiring pattern 30a of the electrode portion 28a is an electrode pattern constituting a stripe electrode. However, the present invention is not limited to such a constitution, and the pattern may be any of the conventionally known electrode patterns such as an X electrode, a bar-and-stripe electrode, a diamond electrode, and a snowflake electrode, as long as it is an electrode pattern used in a capacitive type touch sensor (panel).

The thin metal wires 14 formed in the form of a mesh in the electrode portion 28a do not have the disconnection portions 26 and are continuous to each other. In contrast, in the thin metal wires 14 formed in the form of a mesh in the dummy electrode portion 28b, the plurality of disconnection portions (cut portions) 26 has been provided, and thus a plurality of disconnections has been added thereto. Between the thin metal wire 14 in the electrode portion 28a and the thin metal wire 14 in the dummy electrode portion 28b, the disconnection portion 26 is provided without exception. Therefore, the thin metal wire 14 of the electrode portion 28a and the thin metal wire 14 of the dummy electrode portion 28b are disconnected from each other and in a discontinuous state. That is, the dummy electrode portion 28b is electrically insulated from the electrode portion 28a.

As described above, the mesh pattern 30 of the mesh-like wiring 28 is a mesh pattern including the plurality of disconnection portions 26. Herein, the constitution necessary for the mesh pattern 30 of the mesh-like wiring 28 of the conductive film 11 of the present invention will be described later.

The first protective layer 20a is bonded to approximately the whole surface of the first wiring layer 16a through the first adhesive layer 18a so as to cover the thin metal wires 14 of the first wiring layer 16a.

Furthermore, the second protective layer 20b is bonded to approximately the whole surface of the second wiring layer 16b through the second adhesive layer 18b so as to cover the thin metal wires 14 of the second wiring layer 16b.

Each of the first adhesive layer 18a and the second adhesive layer 18b can be formed of the same material and can be formed in the same manner as the adhesive layer 18 of the conductive film 10 shown in FIG. 4. However, the material of the first adhesive layer 18a may be the same as or different from the material of the second adhesive layer 18b.

Moreover, each of the first protective layer 20a and the second protective layer 20b can be formed of the same material and can be formed in the same manner as the protective layer 20 of the conductive film 10 shown in FIG. 4. However, the material of the first protective layer 20a may be the same as or different from the material of the second protective layer 20b.

Both the refractive index n2 of the first protective layer 20a and the refractive index n3 of the second protective layer 20b may be a value equal or close to the refractive index n0 of the transparent substrate 12, similarly to the protective layer 20 of the conductive film 10 according to the first embodiment. In this case, both the relative refractive index nr2 of the transparent substrate 12 with respect to the first protective layer 20a and the relative refractive index nr3 of the transparent substrate 12 with respect to the second protective layer 20b are a value close to 1. Herein, the definitions of the refractive index and the relative refractive index are the same as the definitions in the first embodiment.

Accordingly, the relative refractive index nr2 of the transparent substrate 12 with respect to the first protective layer 20a is defined as nr2=(n2/n0), and the relative refractive index nr3 of the transparent substrate 12 with respect to the first protective layer 20b is defined as nr2=(n3/n0).

Herein, similarly to the aforementioned relative refractive index nr1, it is preferable that the relative refractive index nr2 and the relative refractive index nr3 are in a range of 0.86 or more and 1.15 or less, and a range of 0.91 or more and 1.08 or less is more preferable.

By limiting the relative refractive index nr2 and the relative refractive index nr3 to this range, it is possible to further improve moire recognition property, as the limitation of the range of the relative refractive index nr1.

Figure 8:
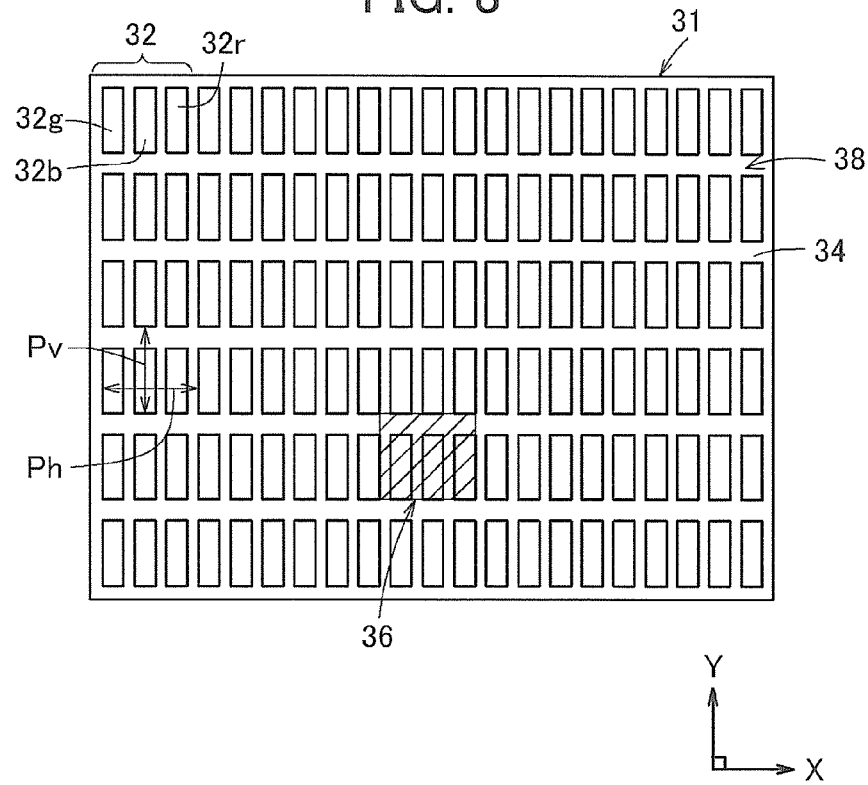
FIG. 8 is a schematic view illustrating an example of a pixel array pattern of a portion of a display unit to which the conductive film according to the present invention is applied.

The conductive film 10 of the first embodiment and the conductive film 11 of the second embodiment of the present invention described above are applied to, for example, a touch panel of a display unit 31 (display portion) of which a part is schematically shown in FIG. 8. The conductive films have a mesh pattern (24, 30) having been optimized in terms of moire recognition property with respect to the pixel array pattern of the display unit 31, that is, the black matrix (hereinafter, also referred to as "BM") pattern of the display unit 31.

Herein, in the present invention, the mesh pattern having been optimized in terms of moire recognition property with respect to the BM (pixel array) pattern refers to one, two, or more groups of mesh patterns in which moire with respect to a predetermined BM pattern is not visually recognized by a human being. Furthermore, in the present invention, in two or more groups of optimized mesh patterns, it is possible to rank the mesh patterns from a mesh pattern which is most unlikely to be visually recognized to a mesh pattern which is less likely to be visually recognized, and one mesh pattern in which moire is most unlikely to be visually recognized can also be determined.

Figure 17A:
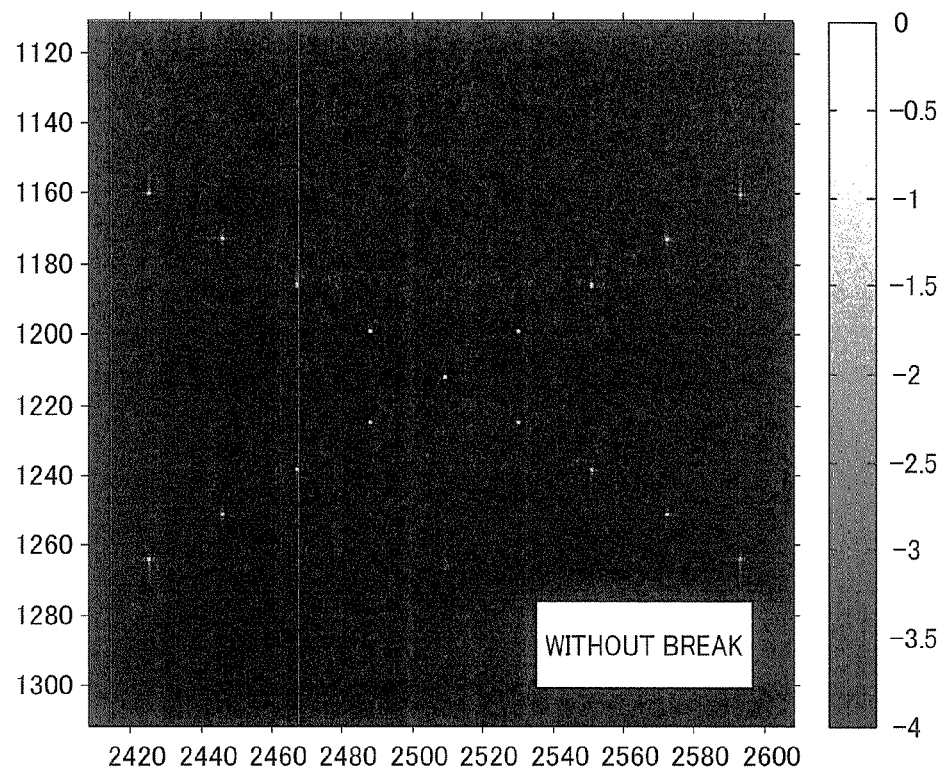
FIG. 17A is a view showing the spatial frequency characteristics in a case of a mesh pattern (without breaks) not having breaks (disconnection portions)
Figure 17B:
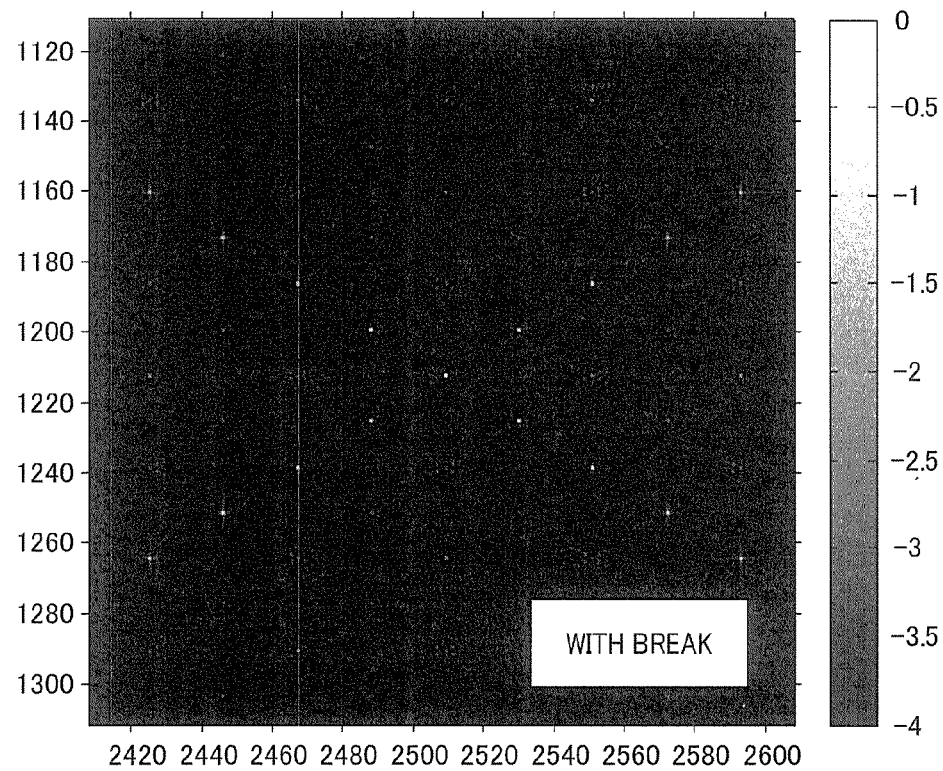
FIG. 17B is a view showing the spatial frequency characteristics in a case of a mesh pattern (with breaks) including breaks having a regular period.

In the present invention, the spectral intensity of the moire of the lowest frequency represented by the convolution of the spatial frequency characteristics of the mesh pattern, which are obtained at least when the mesh pattern is observed from the front, and the spatial frequency characteristics of the BM pattern of the display unit, which are obtained at least when the BM pattern is observed from the front, needs to be at least equal to or less than −3.6 expressed in terms of the common logarithm ($10^{-3.6}$ expressed in terms of the antilogarithm). Herein, a case in which the mesh pattern of the conductive film is a mesh pattern including a plurality of disconnection portions is described as a typical example. However, as shown in FIGS. 17A and 17B, the moire is more easily visually recognized in a mesh pattern including a plurality of disconnection portions than in a mesh pattern not including disconnection portions. Accordingly, needless to say, the present invention can be applied to the mesh pattern not including disconnection portions. That is, regardless of the presence or absence of the disconnection portions, the present invention can be applied to a mesh pattern in which the spectral intensity of the moire of the lowest frequency represented by the convolution of the spatial frequency characteristics of both the mesh pattern and the BM pattern of the display unit is equal to or less than −3.6 expressed in terms of the common logarithm ($10^{-3.6}$ expressed in terms of the antilogarithm).

In the present invention, the frequency of the moire as a target is preferably equal to or less than 3 cycles/mm. This is because, from experience, it was understood that the frequency of the moire as an issue is within 3 cycles/mm by sensory evaluation.

Meanwhile, in the present invention, in a case in which the moire recognition property has been optimized such that the moire is not visually recognized even when the mesh pattern not including the disconnection portions is superimposed on the BM pattern of the display unit, if the plurality of disconnection portions are added to the mesh pattern, at least one of the position, length, arrangement (number), and the like of the disconnection portions is caused to have randomness without regularity, that is, the plurality of disconnection portions is randomly arranged. In this way, it is possible to improve the moire recognition property of a mesh pattern including the plurality of disconnection portions, even when the mesh pattern is superimposed on the BM pattern.

In the conductive film having the mesh pattern including the plurality of disconnection portions, when the moire recognition property of the mesh pattern in which the plurality of disconnection portions is connected to each other (the mesh pattern not including the disconnection portions) has been optimized, it is possible to improve the moire recognition property by forming a random wiring pattern, in which the plurality of disconnection portions has been randomly arranged, as the dummy electrode wiring pattern in the mesh pattern.

As the mesh pattern not including the disconnection portions, in which the moire recognition property has been optimized, it is possible to use the mesh pattern of the conductive film described in the specification of Japanese Patent Application No. 2012-82711 filed by the present applicant. In the specification, from the peak frequencies and peak intensities of a plurality of spectral peaks of two-dimensional Fourier spectra of transmittance image data of the mesh pattern, and from the peak frequencies and peak intensities of a plurality of spectral peaks of two-dimensional Fourier spectra of transmittance image data of a pixel array pattern, the frequencies and spectral intensities of moires are calculated. Thereafter, by acting visual response characteristics of a human being on the calculated frequencies and spectral intensities of moires, the frequencies and intensities of moires are obtained. The mesh pattern disclosed in the aforementioned specification is a wiring pattern in which the sum of the spectral intensities of the moires, which have frequencies falling into a predetermined range of a frequency determined according to the visual response characteristics, is equal to or less than a predetermined value with respect to the obtained frequencies and intensities of moires.

The mesh pattern not including the disconnection portions, in which the moire recognition property has been optimized, is not limited to the mesh pattern described in the aforementioned specification, and may be a conventionally known mesh pattern not including disconnection portions in which the moire recognition property has been optimized. As such a mesh pattern, it is possible to use the mesh pattern described in Japanese Patent Application No. 2011-221432, Japanese Patent Application No. 2011-221434, Japanese Patent Application No. 2012-82706, Japanese Patent Application No. 2012-166946, and the like filed by the present applicant.

Therefore, in the conductive films 10 and 11 of the present invention, the mesh patterns 24 and 30 having been optimized in terms of moire recognition property with respect to the pixel array pattern of a display unit 31, that is, the black matrix (hereinafter, also referred to as "BM") pattern, and the synthetic mesh pattern composed of the mesh patterns 24 and 30 satisfy at least one of the aforementioned conditions.

The details of the optimization of the moire recognition property of the mesh pattern with respect to a predetermined BM pattern will be described later.

The conductive film of the present invention is basically constituted as above.

FIG. 8 is a schematic view illustrating an example of a pixel array pattern of a part of a display unit to which the conductive film according to the present invention is applied.

As a part thereof is illustrated in FIG. 8, plural pixels 32 are arranged in a matrix shape to form a predetermined pixel array pattern in the display unit 31. One pixel 32 has a configuration in which three sub-pixels (a red sub-pixel 32r, a green sub-pixel 32g, and a blue sub-pixel 32b) are arranged in the horizontal direction. One sub-pixel has a rectangular shape which is long in the vertical direction. The array pitch in the horizontal direction (horizontal pixel pitch Ph) of the pixels 32 and the array pitch in the vertical direction (vertical pixel pitch Pv) of the pixels 32 are substantially equal to each other. That is, a shape formed by one pixel 32 and a black matrix (BM) 34 (pattern material) surrounding the one pixel 32 is square (see a hatched area 36). The aspect ratio of one pixel 32 is not equal to 1, but set to be the length in the horizontal direction (lateral)>the length in the vertical direction (longitudinal).

As can be apparently seen from FIG. 8, since the pixel array pattern formed by the sub-pixels 32r, 32g, and 32b of the plural pixels 32 is defined by the BM pattern 38 of the BM 34 surrounding the respective sub-pixel 32r, 32g, and 32b and the moire occurring when the display unit 31 and the conductive film 10 or 11 are superimposed on each other is generated by the interference between the BM pattern 38 of the BM 34 of the display unit 31 and the mesh pattern 24 or 30 of the conductive film 10 or 11, the BM pattern 38 is strictly an inverted pattern of the pixel array pattern, but herein, both are treated to represent the same pattern.

For example, when the conductive film 10 or 11 is disposed on the display panel of the display unit 31 having the BM pattern 38 formed by the BM 34, since the mesh pattern 24 of the conductive film 11 has been optimized in terms of moire recognition property with respect to the BM (pixel array) pattern 38, there is no interference in spatial frequency between the array period of the pixels 32 and the wiring arrangement of the thin metal wires 14 of the conductive film 10 or 11, and thus occurrence of moire is suppressed.

The display unit 31 illustrated in FIG. 8 may be configured as a display panel such as a liquid crystal panel, a plasma panel, an organic EL panel, and an inorganic EL panel.

Figure 9:
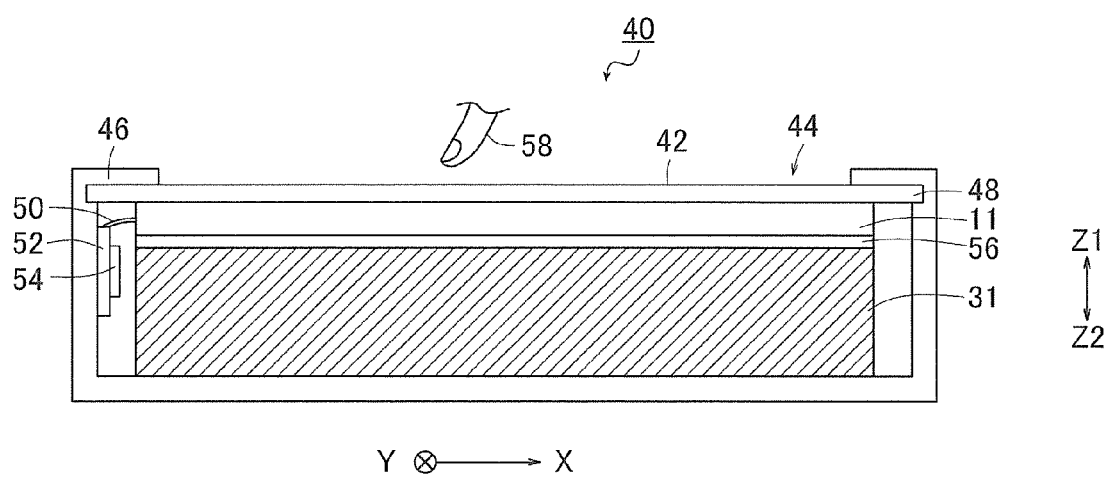
FIG. 9 is a schematic cross-sectional view of an example of a display device into which the conductive film shown in FIG. 7 has been incorporated.

Next, a display device into which the conductive film according to the present invention is assembled will be described below with reference to FIG. 9. In FIG. 9, a projected capacitive type touch panel into which the conductive film 11 according to the second embodiment of the present invention is assembled will be described as a representative example of the display device 40, but it is needless to say that the present invention is not limited to this example.

As shown in FIG. 9, the display device 40 includes the display unit 31 (refer to FIG. 8) that can display a color image and/or a monochrome image, a touch panel 44 that detects a contact position from an input screen 42 (arrow Z1 direction side), and a housing 46 in which the display unit 31 and the touch panel 44 are housed. The user can access the touch panel 44 through a large opening provided on the surface (arrow Z1 direction side) of the housing 46.

The touch panel 44 includes not only the conductive film 11 (refer to FIGS. 5, 6 and 7) described above but also a cover member 48 laminated on the surface (arrow Z1 direction side) of the conductive film 11, a flexible substrate 52 electrically connected to the conductive film 11 through a cable 50, and a detection control unit 54 disposed on the flexible substrate 52.

The conductive film 11 is bonded to the surface (arrow Z1 direction side) of the display unit 31 through an adhesive layer 56. The conductive film 11 is disposed on the display screen such that the other main surface side (second wiring layer 16b side) faces the display unit 31.

The cover member 48 functions as the input screen 42 by covering the surface of the conductive film 11. In addition, by preventing direct contact of a contact body 58 (for example, a finger or a stylus pen), it is possible to suppress the occurrence of a scratch, adhesion of dust, and the like, and thus it is possible to stabilize the conductivity of the conductive film 11.

For example, the material of the cover member 48 may be a glass or a resin film. One surface (arrow Z2 direction side) of the cover member 48 may be coated with silicon oxide or the like and may be bonded to one surface (arrow Z1 direction side) of the conductive film 11. In order to prevent damage due to rubbing or the like, the conductive film 11 and the cover member 48 may be pasted together.

The flexible substrate 52 is an electronic substrate having flexibility. In the example shown in the drawing, the flexible substrate 52 is fixed to the inner wall of the side surface of the housing 46, but the position fixedly set up may be changed in various ways. The detection control unit 54 constitutes an electronic circuit that catches a change in the capacitance between the contact body 58 and the conductive film 11 and detects the contact position (or the proximity position) when the contact body 58 that is a conductor is brought into contact with (or comes close to) the input screen 42.

The display device to which the conductive film according to the present invention is applied basically has the above-mentioned configuration.

Next, evaluation of moire recognition property of the mesh pattern of the conductive film with respect to a predetermined BM pattern of the display device in the present invention and procedures of optimization will be described below. That is, in the conductive film according to the present invention, the procedures of determining a mesh pattern which is optimized so that moire with respect to a predetermined BM pattern of the display device is not visually recognized by a human being will be described below.

Figure 10:
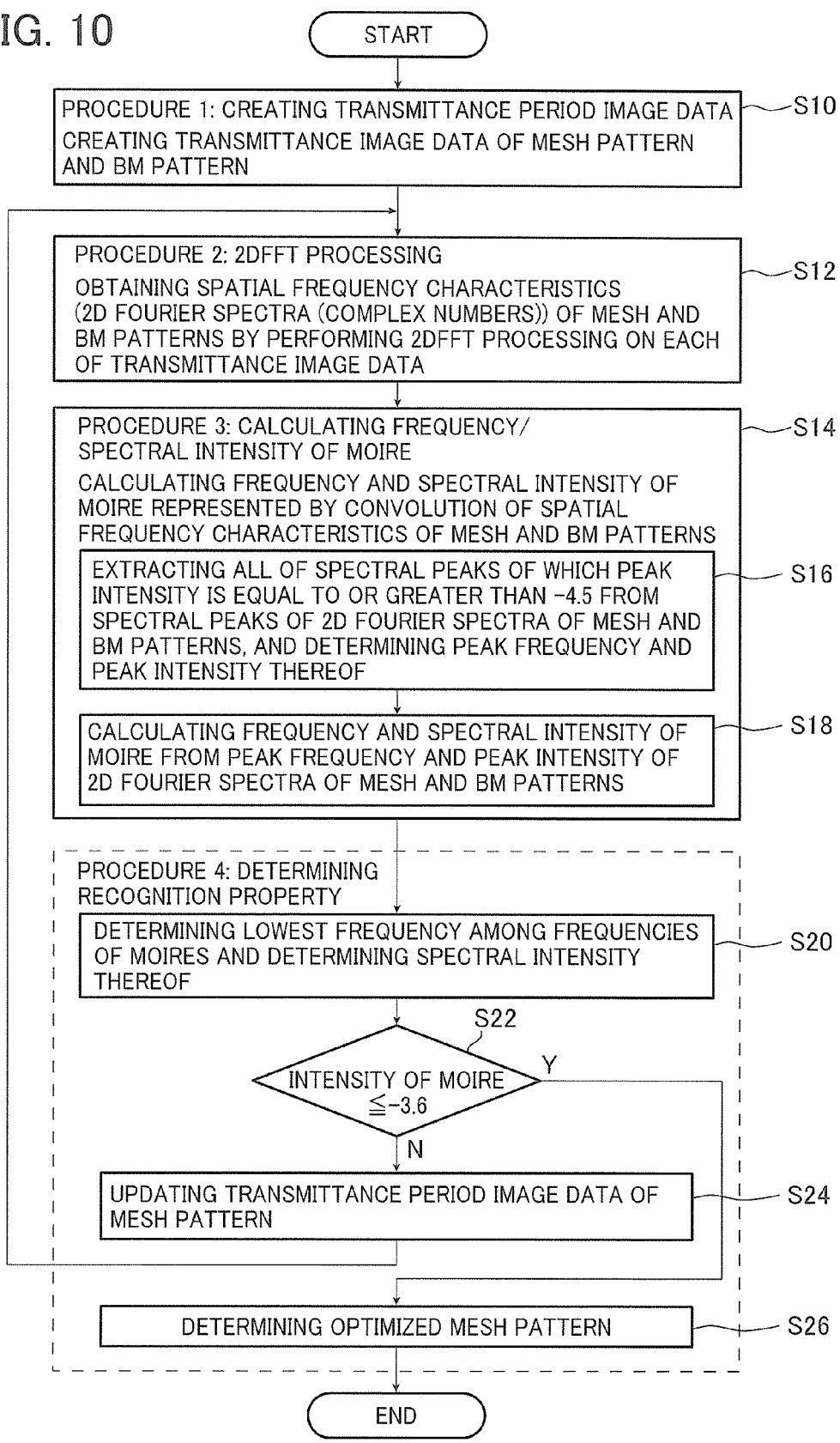
FIG. 10 is a flowchart showing an example of a method for determining a mesh pattern of the conductive film according to the present invention.

FIG. 10 is a flowchart showing an example of a method for determining a mesh pattern of the conductive film according to the present invention.

In the method for determining a mesh pattern of a conductive film of the present invention, from peak frequencies and peak intensities obtained by frequency analysis using Fast Fourier Transform (FFT) of a BM (pixel array) pattern of a display unit of a display device and a mesh pattern of a conductive film, the frequencies and spectral intensities of moires are calculated. Thereafter, the calculated frequencies and spectral intensities of the moires are compared with the conditions of frequencies and spectral intensities of moires that have been determined from experience and prevent the moire from being visually recognized. Then, a mesh pattern satisfying the conditions is determined to be a mesh pattern which has been optimized to prevent the moire from being visually recognized. In the method of the present invention, FFT is generally used for the frequency and spectral intensity of moire. However, depending on the usage of FFT, the frequency and spectral intensity of a target is greatly varied. Accordingly, the following procedures are specified.

In the method of the present invention, first, as Procedure 1, transmittance period image data (hereinafter, also referred to as transmittance image data) of the BM pattern and the mesh pattern is created. That is, as shown in FIG. 10, in Step S10, transmittance period image data of the BM pattern 38 (BM 34) (see FIG. 8) of the display unit 31 of the display device 40 shown in FIG. 9 and transmittance period image data of a mesh pattern 24 (thin metal wires 14) (see FIG. 11B) of a conductive film 10 that includes the disconnection portions 26 are created and obtained. Herein, when the transmittance image data of the BM pattern 38 and the transmittance image data of the mesh pattern 24 including the plurality of disconnection portions 26 have already been prepared or accumulated, the transmittance image data may be obtained from the prepared or accumulated data.

Figures 11A, 11B:
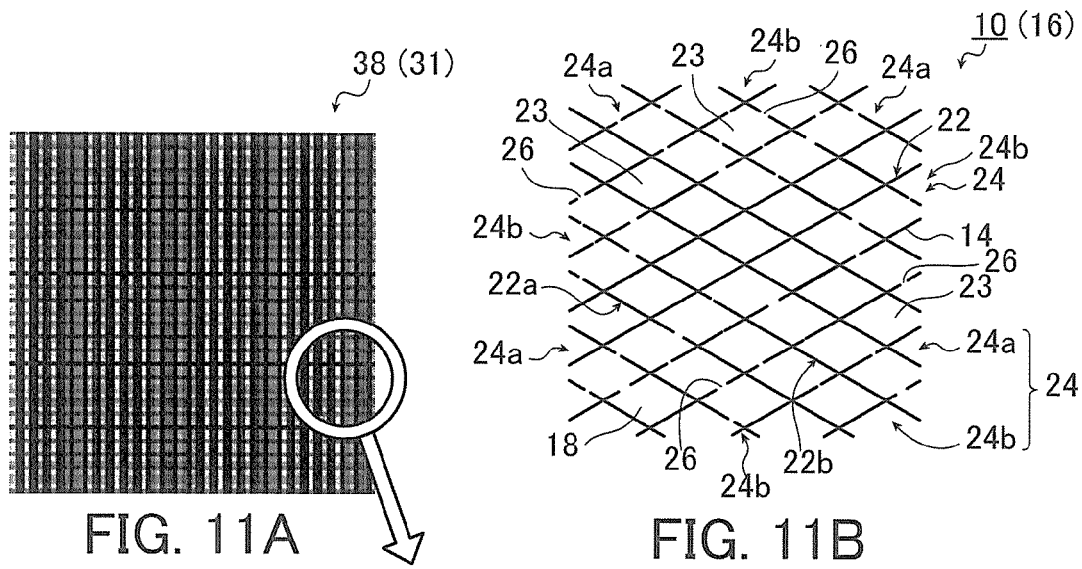
FIG. 11A is a schematic view illustrating an example of a pixel array pattern of a display unit to which the conductive film according to the present invention is applied.
FIG. 11B is a schematic view illustrating an example of a wiring pattern of the conductive film superimposed on the pixel array pattern shown in FIG. 11A.
Figure 11C:
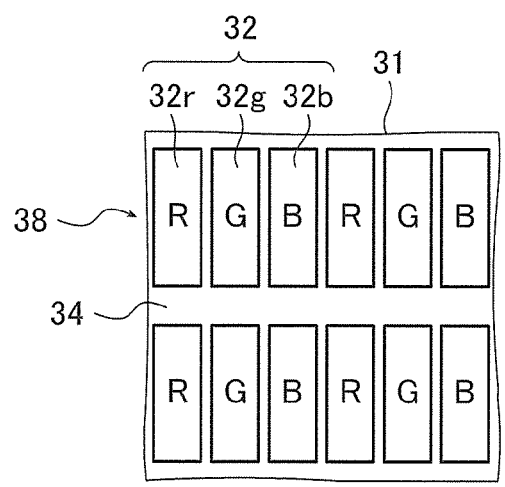
FIG. 11C is a partially enlarged view of the pixel array pattern shown in FIG. 11A.

For example, as illustrated in FIG. 11A and FIG. 11C which is a partially enlarged view of FIG. 11A, the BM pattern 38 of the display unit 31 can be set to a pattern in which each pixel 32 includes three color sub-pixels 32r, 32g, and 32b of RGB, but when a single color is used and, for example, only the sub-pixels 32g of G-channel are used, it is preferable that the transmittance image data of R channel and B channel are set to 0. In the present invention, the image data of the BM 34, that is, the transmittance image data of the BM pattern 38, is not limited to a pattern having rectangular openings (sub-pixels 32r, 32g, and 32b) of the BM 34 as shown in FIG. 11A, and a BM pattern not having the rectangular openings of the BM 34 or a BM pattern having arbitrary BM openings may be designated and used, as long as it is a usable BM pattern. For example, the opening is not limited to a simple rectangular shape, and may have an intricately doglegged shape or a hook shape. Herein, for example, the transmittance image data of the BM pattern 38 had resolution of about 12,700 dpi and was in the form of binarized data in which the opening was represented by 1.0 and other portions were represented by 0.0.

Meanwhile, for example, as shown in FIG. 11B, the mesh pattern 24 of the conductive film 10 can be in the form of square lattices in which the thin metal wires 14 to be wiring inclined by 45° [deg]. The mesh pattern 24 is a wiring pattern in which the plurality of thin metal wires 14 are disconnected from each other by the plurality of disconnection portions 26. The transmittance image data of the mesh pattern 24 is created as period image data including the disconnection portions (breaks) 26. Herein, the transmittance image data of the mesh pattern 24 had resolution of about 12,700 dpi, and was in the form of binarized data in which the internal area of the openings 23 and 29 in the mesh shape was represented by 0.0, and the portion of the thin metal wires 14 that are wiring was represented by 1.0.

Herein, the size of the transmittance image data of the mesh pattern 24 and the BM pattern 38 was specified to be, for example, 5,020 (pixels)×2,423 (pixels). Furthermore, in order to prevent or reduce periodic artifacts at the time of the FFT processing of Procedure 2 which will be described later, it is preferable to extract the data in a repetition period such that the continuity is maintained. For example, it is preferable to set the image size such that the image includes a region corresponding to 4 images.

Thereafter, as Procedure 2, two-dimensional fast Fourier transform (2DFFT (base 2)) is performed on the transmittance image data of the mesh pattern 24 and the BM pattern 38 that are created in Procedure 1, thereby extracting spectra (peaks) of predetermined intensities.

That is, as shown in FIG. 10, in Step S12, the 2DFFT processing is performed on the respective transmittance image data of the mesh pattern 24 and the BM pattern 38 that are created in Step S10, thereby obtaining the spatial frequency characteristics of the mesh pattern 24 including the disconnection portions (breaks) 26, which are obtained at least when the mesh pattern is observed from the front, and the spatial frequency characteristics (two-dimensional Fourier spectra) of the BM pattern 38, which are obtained at least when the BM pattern is observed from the front. At this time, although the two-dimensional Fourier spectra of the respective transmittance image data of the mesh pattern 24 and the BM pattern 38 are represented by complex numbers (including phase information), the spectra (complex numbers) are standardized by being divided by the image size (length×width (pix$^2$)). For example, a spectrum standardized by using the image size (pix$^2$) is given in the form of spectrum (complex number)/image size (5,020×2,433 pix$^2$).

Subsequently, as Procedure 3, from the spatial frequency characteristics of the mesh pattern 24 and the BM pattern 38 obtained in Procedure 2, the frequencies and spectral intensities of the moires represented by the convolution of the spatial frequency characteristics of the mesh pattern 24 and the BM pattern 38 are calculated.

That is, as shown in FIG. 10, in Step S14, from the spatial frequency characteristics of the mesh pattern 24 and the spatial frequency characteristics of the BM pattern 38 that are obtained in Step S12, the frequencies and spectral intensities of the moires represented by the convolution (integration) of the spatial frequency characteristics of the mesh pattern 24 and the BM pattern 38 are calculated.

In Step S14, the frequencies and spectral intensities of the moires can be calculated by the following Steps S16 and S18.

Herein, the spectral intensity of the two-dimensional Fourier spectrum is defined by common logarithm so as to match with the absolute value of the complex number and with the vision of a human being.

As shown in FIG. 10, in Step S16, based on the respective spatial frequency characteristics of the mesh pattern 24 and the BM pattern 38 that are obtained in Step S12, all of the spatial frequencies of the spectra (peaks) of which the spectral intensity ($Log_{10}$ (an absolute value of a spectrum)) defined by the common logarithm is equal to or greater than −4.5 are extracted from the spectra of each of the patterns 62 and 38. That is, from a plurality of spectral peaks of two-dimensional Fourier spectra of the mesh pattern 24 and the BM pattern 38, all of the spectral peaks of which the peak intensity is equal to or greater than −4.5 expressed in terms of the common logarithm are extracted, and the peak frequencies and peak intensities of all of the extracted spectral peaks are calculated.

The information obtained at this point in time includes spatial frequencies fx and fy of the peak values of the spectra and information on a complex number (a+bi). Herein, the peak intensity is handled as an absolute value.

FIG. 12A is a view showing intensity characteristics of two-dimensional Fourier spectra of the transmittance image data of the mesh pattern 24, and FIG. 12B is a view showing intensity characteristics of two-dimensional Fourier spectra of the transmittance image data of the BM pattern 38.

In FIGS. 12A and 12B, a white portion indicates a spectral peak having high intensity. Accordingly, from the results shown in FIGS. 12A and 12B, the peak frequency and peak intensity of each spectral peak are calculated for each of the mesh pattern 24 and the BM pattern 38. That is, the position on frequency coordinates of each of the spectral peaks which are shown in the intensity characteristics of the two-dimensional Fourier spectra of the mesh pattern 24 and the BM pattern 38 shown in FIGS. 12A and 12B respectively, that is, the peak position represents the peak frequency of the spectral peak, and the intensity of the two-dimensional Fourier spectrum in the peak position represents the peak intensity thereof.

The peak frequency and peak intensity of each of the spectral peaks of the mesh pattern 24 and the BM pattern 38 are calculated and obtained as below.

First, in calculating peaks for obtaining the peak frequency, from the basic frequencies of the mesh pattern 24 and the BM pattern 38, frequency peaks are calculated. This is because the transmittance image data subjected to the 2DFFT processing is discrete values, and thus the peak frequency depends on the reciprocal of the image size. As shown in FIG. 13, the positions of the frequency peaks can be expressed as a combination of bars a and b which are independent two-dimensional basic frequency vector components. Accordingly, naturally, the obtained peak positions form a lattice shape. FIG. 13 is a graph showing the positions of the frequency peaks in case of the BM pattern 38, but the positions of the frequency peaks of the mesh pattern 24 can be determined in the same way.

Meanwhile, in obtaining the peak intensity, the peak position is determined in the process of obtaining the peak frequency as described above. Therefore, the intensity (absolute value) of the two-dimensional Fourier spectrum that the peak position has is obtained. At this time, because digital data has undergone FFT processing, the peak position includes a plurality of pixels in some cases. For example, when the intensity (Sp) characteristics of the two-dimensional Fourier spectrum are represented by a curve (analogue value) shown in FIG. 14A, the intensity characteristics of the same two-dimensional Fourier spectrum having undergone digitalization processing is represented by a bar graph (digital value) shown in FIG. 14B. Herein, a peak P of the intensity in the two-dimensional Fourier spectrum shown in FIG. 14A includes two pixels in the corresponding FIG. 14B. Consequently, in order to obtain the intensity in the peak position, within a region including a plurality of pixels in the vicinity of the peak position, the sum of spectral intensities of a plurality of pixels ranked high in terms of the spectral intensity is preferably used as the peak intensity (absolute value). For example, within a region of 5×5 pixels, the sum of spectral intensities of top 5 pixels ranked high in terms of the spectral intensity are preferably used as the peak intensity.

Herein, the obtained peak intensity is preferably standardized by using the image size. In the aforementioned example, as described above, the peak intensity is preferably standardized in advance by using the image size (5,020×2,433 pix$^2$) (Parseval's theorem).

Then, as shown in FIG. 10, in Step S18, from the peak frequencies and peak intensities of the two-dimensional Fourier spectra of the mesh pattern 24 and the BM pattern 38 that are calculated in Step S16, the frequencies and spectral intensities of moires are calculated respectively. In this case, the peak intensities and spectral intensities of the moire are also handled as absolute values.

In the actual space, originally, the moire is caused by the multiplication of the transmittance period image data of the mesh pattern 24 and the BM pattern 38. Consequently, in the spatial frequency space, convolution integral of the patterns is performed. However, since the peak frequencies and peak intensities of the two-dimensional Fourier spectra of both the mesh pattern 24 and the BM pattern 38 are calculated in Step S16, a difference (an absolute value of the difference) in the frequency peak between the two patterns can be calculated; the calculated difference can be taken as the frequency of the moire; a product of 2 pairs of vector intensities obtained by combining the two patterns can be calculated; and the calculated product can be taken as the spectral intensity (absolute value) of the moire.

The frequency and spectral intensity of the moire obtained in this way can be regarded as outcomes of the convolution integral of the respective spatial frequency characteristics of the mesh pattern 24 and the BM pattern 38 obtained in Step S12.

Herein, the difference between the respective frequency peaks of the intensity characteristics of the two-dimensional Fourier spectra of the mesh pattern 24 and the BM pattern 38 respectively shown in FIGS. 12A and 12B corresponds to the relative distance between the peak positions on the frequency coordinates of the frequency peaks of the mesh pattern 24 and the BM pattern 38 in the intensity characteristics obtained by superimposing the intensity characteristics of the two-dimensional Fourier spectra of both patterns.

Each of the mesh pattern 24 and the BM pattern 38 has a plurality of spectral peaks in the two-dimensional Fourier spectra thereof. Therefore, the difference of frequency peaks that is a value of the relative distance, that is, the frequency of the moire, is obtained in a plural number. Consequently, if both patterns have a large number of spectral peaks in the two-dimensional Fourier spectra, the number of the obtained frequency of the moire is also increased, and as a result, it takes a long period of time for calculation processing. In such a case, for the spectral peaks in the two-dimensional Fourier spectra of both patterns, only the peaks having a high intensity may be selected in advance. In this case, because only the difference between the selected peaks is calculated, the time taken for calculation can be shortened.

Figure 15:
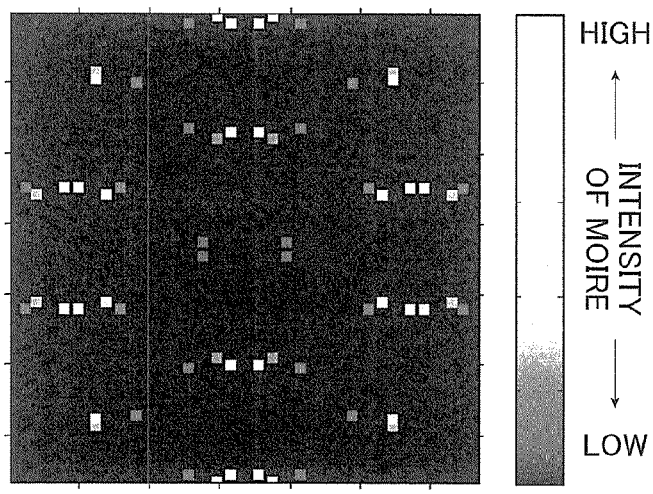
FIG. 15 is a view schematically illustrating frequency information and spectral intensities of moires occurring due to the interference between the pixel array pattern shown in FIG. 11A and the wiring pattern shown in FIG. 11B.

FIG. 15 shows the frequencies and spectral intensities of moires obtained in this way. FIG. 15 is a view schematically illustrating the frequencies and spectral intensities of the moires occurring due to the interference between the pixel array pattern shown in FIG. 11A and the mesh pattern shown in FIG. 11B. FIG. 15 can be regarded as being an outcome of the convolution integral of the intensity characteristics of the two-dimensional Fourier spectra shown in FIGS. 12A and 12B.

In FIG. 15, the frequency of the moire is indicated by the position on the ordinate and abscissa, and the spectral intensity of the moire is indicated by the shade of grey (achromatic color). As shown in FIG. 15, the darker the color, the lower the spectral intensity, and the lighter the color, that is, the closer the color is to white, the higher the spectral intensity.

Thereafter, as Procedure 4, the moire recognition property is determined.

That is, as shown in FIG. 10, in Step S20, among the frequencies of the moires calculated in Step S18 (S14), the lowest frequency is determined, and the spectral intensity of moire of the lowest frequency is determined. Herein, only the frequencies of the moires in a data within 3 cycles/mm are considered. That is, among the frequencies of the moires calculated in Step S18 (S14), the frequencies of the moires within 3 cycles/mm are used and ranked, the lowest frequency of the moire is determined, and the spectral intensity thereof is determined.

For determining the moire recognition property and the like, the frequency and spectral intensity of the moire are convoluted with a Visual Transfer Function (VTF) based on a Dooley Shaw function or the like that shows standard visual response characteristic of a human being. However, being a function that depends on an observation distance, VTF is not used in the present invention. In the display device equipped with a touch panel and the like to which the conductive film of the present invention is applied, the observation distance is not fixed at the time of actual observation, and thus VTF is not used in the present invention.

Subsequently, as shown in FIG. 10, in Step S22, the spectral intensity of the moire of the lowest frequency determined in Step S20 is compared with −3.6, and whether or not the spectral intensity of the moire is equal to or greater than −3.6 is determined.

For a plurality of mesh patterns 62, in examples which will be described later, by using a plurality of samples having different types of the dummy electrode wiring pattern 24b including the plurality of disconnection portions 26 in the dummy electrode portion 22b, the spectral intensity of the moire of the lowest frequency was determined, and the mesh pattern 24 and the spectral intensity of the moire of the lowest frequency were evaluated by 3 researchers. As a result, as shown in Table 1 which will be described later, the sample in which the spectral intensity of the moire of the lowest frequency was equal to or less than −3.8 expressed in terms of the common logarithm (equal to or less than $10^{-3.8}$ expressed in terms of the antilogarithm) was evaluated to be "A" by the sensory evaluation because the moire was not visually recognized; the sample in which the spectral intensity thereof was greater than −3.8 and equal to or less than −3.6 expressed in terms of the common logarithm (greater than $10^{-3.8}$ and equal to or less than $10^{-3.6}$ expressed in terms of the antilogarithm) was evaluated to be "B" by the sensory evaluation because the moire was just slightly recognized but was ignorable; and the sample in which the spectral intensity thereof was greater than −3.6 expressed in terms of the common logarithm (greater than $10^{-3.6}$ expressed in terms of the antilogarithm) was evaluated to be "C (unusable)" by the sensory evaluation because the moire was visually recognized.

Accordingly, in the present invention, the spectral intensity of the moire of the lowest frequency is limited to be equal to or less than −3.6 expressed in terms of the common logarithm (equal to or less than $10^{-3.6}$ expressed in terms of the antilogarithm).

When the spectral intensity of the moire of the lowest frequency is greater than −3.6 expressed in terms of the common logarithm (greater than $10^{-3.6}$ expressed in terms of the antilogarithm), the process moves onto Step S24, the transmittance image data of the mesh pattern 24 is updated to transmittance image data of a new mesh pattern, and the process returns to Step S12.

Herein, the new mesh pattern to be updated may be prepared in advance or newly created. When the mesh pattern is newly created, the transmittance image data of the mesh pattern, specifically, one or more among the position, the pitch, and the width of the plurality of disconnection portions (breaks) 26 of the dummy electrode wiring pattern 24b may be changed, or the shape or size of the mesh pattern may be changed. Moreover, randomness may be given to these parameters.

Then, Step S12 as a step of obtaining the spatial frequency characteristics, Step S14 (S18) as a step of calculating the frequency and spectral intensity of the moire, Step S20 as a step of calculating the spectral intensity of the moire of the lowest frequency, Step S22 as a step of comparing the spectral intensity of the moire of the lowest frequency with −3.6 expressed in terms of the common logarithm ($10^{-3.6}$ expressed in terms of the antilogarithm), and Step S24 as a step of updating the transmittance image data of the mesh pattern are repeated until the spectral intensity of the moire of the lowest frequency becomes equal to or less than −3.6 expressed in terms of the common logarithm ($10^{-3.6}$ expressed in terms of the antilogarithm).

When the spectral intensity of the moire of the lowest frequency is equal to or less than −3.6 expressed in terms of the common logarithm ($10^{-3.6}$ expressed in terms of the antilogarithm), the process moves onto Step S26, and the mesh pattern 24 is determined to be an optimized mesh pattern and set to be the mesh pattern 24 (30) of the conductive film 10 or 11 of the present invention.

In this way, the method for determining a mesh pattern of a conductive film of the present invention ends, and as a result, it is possible to prepare the conductive film of the present invention having an optimized mesh pattern that inhibits the occurrence of moire even being superimposed on a BM pattern of a display unit of a display device and has excellent moire recognition property.

EXAMPLES

Figure 16:
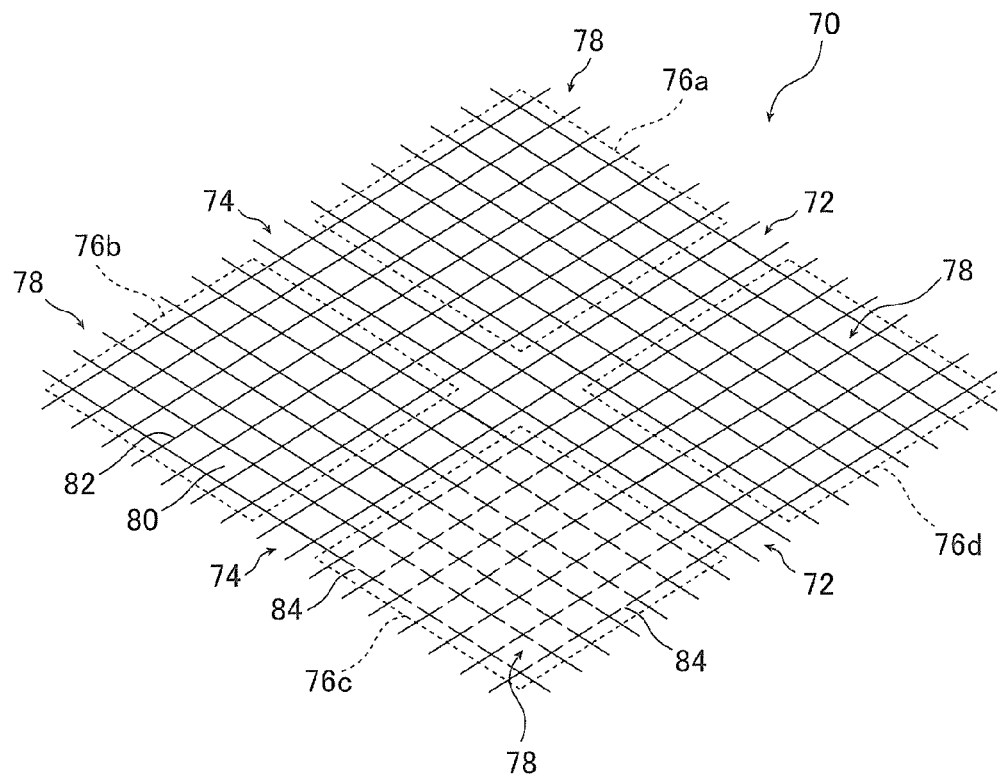
FIG. 16 is a plan view showing a simulation sample of a mesh pattern of Comparative example 1.

A mesh pattern 70 shown in FIG. 16 was prepared as a simulation sample of Comparative example 1. The mesh pattern 70 of Comparative example 1 was a wiring pattern constituted with an electrode wiring pattern 74 of an X electrode 72 constituting an effective electrode region and a dummy electrode wiring pattern 78 of 4 dummy electrodes 76a, 76b, 76c, and 76d. The mesh pattern 70 had a plurality of disconnection portions 84 each of which was regularly provided at the center of each of 4 sides composed of thin metal wires 82 that formed a mesh shape of rhomboids of all of openings 80 formed by the dummy electrode wiring pattern 78. In the side between the electrode wiring pattern 74 and the dummy electrode wiring pattern 78, the disconnection portion 84 was also provided in a central position of each of the thin metal wires 82 between the patterns. In the example shown in FIG. 16, for simplifying the drawing, the disconnection portion 84 is shown only in the dummy electrode wiring pattern 78 of a single dummy electrode 76c and is not shown in the dummy electrode wiring pattern 78 of the 3 dummy electrodes 76a, 76b, and 76d.

As a reference example, a mesh pattern of mesh-like wiring not including the disconnection portions was prepared as a simulation sample.

Furthermore, based on Comparative example 1, mesh patterns of Examples 1 to 6 and Comparative examples 2 to 4 were prepared as simulation samples by changing the length, the position, the arrangement, and the number of the disconnection portions 84.

In each mesh pattern 70 and the like, the length of one side of all of the mesh shapes of a rhomboid was set to be 144 µm, and internal angles of the rhomboid were set to be 76° and 104°. Moreover, as the thin metal wires 82 constituting the sides of each mesh pattern, metal wires having a line width of 6 µm were used.

In the mesh pattern 70 of Comparative example 1, the length of the disconnection portions (breaks) 82 was set to be 20 µm (a break length or a break interval).

In contrast, in each of the mesh patterns of Examples 1 and 2, the length (the break length or the break interval) of the disconnection portions (breaks) 84 was changed with respect to the mesh pattern 70 of Comparative example 1. However, the mesh patterns of Examples 1 and 2 were the same as the mesh pattern 70 of Comparative example 1, except that the length of the disconnection portions 84 was changed to 5 µm (Example 1) and to 10 µm (Example 2) from 20 µm in Comparative example 1.

The mesh patterns of Examples 3 to 5 were obtained by changing the position of the disconnection portions 84 from the central position of the sides of the rhombic mesh shape of the mesh pattern of Comparative example 1 such that the disconnection portions were randomly arranged.

In Example 3, the position of the disconnection portions 84 in the 4 sides of one of the rhombic mesh shapes of the dummy electrode wiring pattern 78 of the 4 dummy electrodes 76a, 76b, 76c, and 76d was changed from the central position in Comparative example 1, such that the disconnection portions were placed in random positions other than the central position. Therefore, the mesh pattern of Example 3 was a wiring pattern repeating this pattern in other rhombic mesh shapes.

In Example 4, the position of the disconnection portions 84 in the 4 sides of all of the rhombic mesh shapes of the dummy electrode wiring pattern 78 was changed from the central position in Comparative example 1, such that the disconnection portions were placed in completely random positions.

In Example 5, not only the position of the disconnection portions 84 in the 4 sides of all of the rhombic mesh shapes of the dummy electrode wiring pattern 78 but also the position of the disconnection portions 84 in each side between the electrode wiring pattern 74 and the dummy electrode wiring pattern 78 were changed from the central position of Comparative example 1, such that the disconnection portions were placed in completely random positions.

In Example 6, the mesh pattern 70 of Comparative example 1 was changed such that all of the disconnection portions 84 were removed from the dummy electrode wiring pattern 78 of the 4 dummy electrodes 76a, 76b, 76c, and 76d so as to make the dummy electrodes connected to each other, and the mesh pattern had the disconnection portion 84 only in each side between the electrode wiring pattern 74 and the dummy electrode wiring pattern 78.

In Comparative examples 2 and 3, the number of the disconnection portions 84 in the dummy electrode wiring pattern 78 of all of the dummy electrodes 76a, 76b, 76c, and 76d was reduced compared to Comparative example 1.

In Comparative example 2, in all of the dummy electrode wiring patterns 78, the number of the disconnection portions 84 in a line direction (a horizontal direction in FIG. 16: an x-direction on x,y coordinates) was halved such that the disconnection portions 84 were provided in every other line of the thin metal wires 82.

In Comparative example 3, in all of the dummy electrode wiring patterns 78, the number of the disconnection portions 84 in a column direction (a vertical direction in FIG. 16: a y-direction on x,y coordinates) was halved such that the disconnection portions 84 were provided in every other line of the thin metal wires 82.

In Comparative example 4, in all of the dummy electrode wiring patterns 78, the number of the disconnection portions 84 in a column direction (a vertical direction in FIG. 16: a y-direction on x,y coordinates) was halved such that the disconnection portions 84 were provided in every other line of the thin metal wires 82.

In Comparative example 5, in all of the dummy electrode wiring patterns 78, the disconnection portions 84 were provided only in a single line direction (one of the thin metal wires 82 crossing the other in FIG. 16).

The simulation of the interference between each of the mesh patterns and the BM pattern 38, which occurs when the simulation sample of the conductive film having the mesh pattern of each of Examples 1 to 6, Comparative examples 1 to 4, and the reference example is superimposed on the simulation sample of the display unit 31 having the BM pattern 38 shown in FIG. 11, was performed. In this way, the spectral intensity of the moire of the lowest frequency represented by the convolution of the spatial frequency characteristics of each of the mesh patterns and the BM pattern 38 was determined. Furthermore, the moire (the result of the simulation of interference between the mesh pattern and the BM pattern) occurring due to the interference between the mesh pattern and the BM pattern 38 was presented, and sensory evaluation was performed by 3 researchers.

The size of pixels constituting the BM pattern 38 of the display unit 31 was 102 μm×102 μm because the resolution thereof was 250 dpi, and the size of sub-pixels was 26 μm×78 μm.

The results are shown in Table 1.

During the sensory evaluation, by the 3 researchers, the sample in which the moire was not visually recognized was evaluated to be "A", the sample in which the moire was slightly visually recognized but was ignorable was evaluated to be "B", and the sample in which the moire was visually recognized was evaluated to be "C".

TABLE 1

| | Result | |
|---|---|---|
| | Moire of lowest frequency | Result of sensory evaluation |
| Reference example | −4.008 | A |
| Example 1 | −3.868 | A |
| Example 2 | −3.625 | B |
| Example 3 | −4.275 | A |
| Example 4 | −4.255 | A |
| Example 5 | −4.267 | A |
| Example 6 | −3.774 | B |
| Comparative example 1 | −3.501 | C |
| Comparative example 2 | −3.504 | C |
| Comparative example 3 | −3.493 | C |
| Comparative example 4 | −3.508 | C |

As is evident from the results shown in Table 1, Examples 1 and 3 to 5, in which the spectral intensity of the moire of the lowest frequency was equal to or less than −3.8 expressed in terms of the common logarithm (equal to or less than $10^{-3.8}$ expressed in terms of the antilogarithm), were evaluated to be "A" by the sensory evaluation because the moire was not visually recognized. Examples 2 and 6, in which the spectral intensity of the moire of the lowest frequency was greater than −3.8 and equal to or less than −3.6 expressed in terms of the common logarithm (greater than $10^{-3.8}$ and equal to or less than $10^{-3.6}$ expressed in terms of the antilogarithm), were evaluated to be "B" by the sensory evaluation because the moire was slightly visually recognized but was ignorable. In contrast, Comparative examples 1 to 4, in which the spectral intensity of the moire of the lowest frequency was greater than −3.6 expressed in terms of the common logarithm (greater than $10^{-3.6}$ expressed in terms of the antilogarithm), were evaluated to be "C" by the sensory evaluation, and the examples were unusable because the moire was visually recognized.

The above results clearly show the effects of the present invention.

Hitherto, the conductive film of the present invention, the display device equipped with the conductive film of the present invention, and the method for determining a pattern of a conductive film of the present invention have been described based on various embodiments and examples. However, the present invention is not limited to the embodiments and examples. Needless to say, the present invention may be improved in various ways, or the design thereof may be changed, as long as the improvement and change do not depart from the gist of the present invention.

DESCRIPTION OF SYMBOLS

10, 11: CONDUCTIVE FILM
12: TRANSPARENT SUBSTRATE
14, 82: THIN WIRE MADE OF METAL (THIN METAL WIRE)
16, 16*a*, 16*b*: WIRING LAYER
18, 18*a*, 18*b*: ADHESIVE LAYER
20, 20*a*, 20*b*: PROTECTIVE LAYER
22, 28: MESH-LIKE WIRING
22*a*, 28*a*: ELECTRODE PORTION
22*b*, 28*b*: DUMMY ELECTRODE PORTION (NON-ELECTRODE PORTION)
23, 29, 80: OPENING
24, 30, 70: MESH PATTERN
24*a*, 30*a*, 74: ELECTRODE WIRING PATTERN
24*b*, 30*b*, 78: DUMMY ELECTRODE WIRING PATTERN
26, 84: DISCONNECTION PORTION (BREAK)
31: DISPLAY UNIT
32, 32*r*, 32*g*, 32*b*: PIXEL

What is claimed is:

1. A conductive film installed on a display unit of a display device, comprising:
    a transparent substrate; and
    mesh-like wiring which is formed on at least one surface of the transparent substrate and has a mesh pattern formed of a plurality of patterned thin metal wires,
    wherein the mesh pattern of the mesh-like wiring is superimposed on a pixel array pattern of the display unit,
    a spectral intensity of moire of a lowest frequency is equal to or less than −3.6 expressed in terms of common logarithm, and
    the spectral intensity of moire of the lowest frequency is represented by convolution of spatial frequency characteristics of the mesh pattern that are obtained at least when the mesh pattern is observed from a front side and spatial frequency characteristics of the pixel array pattern of the display unit that are obtained at least when the pixel array pattern is observed from a front side.

2. The conductive film according to claim 1, wherein
    the mesh-like wiring has an electrode portion, which includes an electrode wiring pattern formed of the plurality of thin metal wires in a form of a continuous mesh, and a non-electrode portion, which is formed of the plurality of thin metal wires in a form of a mesh, has a plurality of disconnection portions, includes a discontinuous non-electrode wiring pattern, and the non-electrode portion is insulated from the electrode portion,
    the mesh pattern of the mesh-like wiring is constituted with the electrode wiring pattern of the electrode portion and the non-electrode wiring pattern of the non-electrode portion insulated from the electrode wiring pattern, and the spatial frequency characteristics of the mesh pattern are spatial frequency characteristics of the mesh pattern including the plurality of disconnection portions that are obtained at least when the mesh pattern is observed from the front side.

3. The conductive film according to claim 2, wherein the non-electrode wiring pattern of the non-electrode portion is formed of the plurality of thin metal wires in a form of a mesh within a region excluding the electrode portion.

4. The conductive film according to claim 1, wherein a frequency of the moire is given as a difference between a peak frequency of a spectral peak of the spatial frequency characteristics of the mesh pattern and a peak frequency of a spectral peak of the spatial frequency characteristics of the pixel array pattern, and a spectral intensity of the moire is given as a product of a peak intensity of the spectral peak of the mesh pattern and a peak intensity of the spectral peak of the pixel array pattern.

5. The conductive film according to claim 4, wherein the peak intensity is a sum of intensities in a plurality of pixels in a vicinity of a peak position.

6. The conductive film according to claim 4, wherein each peak intensity is standardized by using transmittance period image data of each of the mesh pattern and the pixel array pattern.

7. The conductive film according to claim 1, wherein a frequency of the moire is equal to or less than 3 cycles/mm.

8. The conductive film according to claim 1, wherein the pixel array pattern is a black matrix pattern.

9. A display device, comprising:
a display unit; and
the conductive film according to claim 1 that is installed on the display unit.

10. A touch panel display device, comprising:
the display device according to claim 9; and
a transparent substrate which is disposed on an upper side of the conductive film of the display device and has a touch surface on the side opposite to the conductive film.

11. A conductive film installed on a display unit of a display device, comprising:
a transparent substrate; and
mesh-like wiring which is formed on at least one surface of the transparent substrate and has a mesh pattern formed of a plurality of patterned thin metal wires on one surface thereof,
wherein the mesh-like wiring has an electrode portion, which includes an electrode wiring pattern formed of the plurality of thin metal wires in a form of a continuous mesh, and a non-electrode portion, which is formed of the plurality of thin metal wires in a form of a mesh, has a plurality of disconnection portions, includes a discontinuous non-electrode wiring pattern, and the non-electrode portion is insulated from the electrode portion,
the mesh pattern of the mesh-like wiring is constituted with the electrode wiring pattern of the electrode portion and the non-electrode wiring pattern of the non-electrode portion insulated from the electrode wiring pattern, and is superimposed on a pixel array pattern of the display unit, when the plurality of disconnection portions of the non-electrode wiring pattern of the non-electrode portion is connected to each other, the mesh pattern of the mesh-like wiring prevents moire from being visually recognized, and the non-electrode wiring pattern of the non-electrode portion is a random wiring pattern in which the plurality of disconnection portions have been randomly arranged.

12. The conductive film according to claim 11, wherein the frequency of the moire is equal to or less than 3 cycles/mm.

13. The conductive film according to claim 11, wherein the non-electrode wiring pattern of the non-electrode portion is formed of the plurality of thin metal wires in a form of a mesh within a region excluding the electrode portion.

14. The conductive film according to claim 11, wherein the pixel array pattern is a black matrix pattern.

15. A display device, comprising:
a display unit; and
the conductive film according to claim 11 that is installed on the display unit.

16. A touch panel display device, comprising:
the display device according to claim 15; and
a transparent substrate which is disposed on an upper side of the conductive film of the display device and has a touch surface on the side opposite to the conductive film.

17. A method for determining a mesh pattern of a conductive film which is installed on a display unit of a display device and in which mesh-like wiring having a mesh pattern formed of a plurality of patterned thin metal wires in a form of a continuous mesh has been formed, the method comprising the steps of:
obtaining transmittance period image data of the mesh pattern and transmittance period image data of a pixel array pattern of the display unit on which the mesh pattern is superimposed;
performing two-dimensional Fourier transform on the obtained transmittance period image data of the mesh pattern and on the obtained transmittance period image data of the pixel array pattern to obtain spatial frequency characteristics of the mesh pattern and spatial frequency characteristics of the pixel array pattern, the spatial frequency characteristics of the mesh pattern and the pixel array pattern being obtained at least when the mesh pattern and the pixel array pattern are observed from a front side;
calculating frequencies and spectral intensities of moires represented by convolution of the spatial frequency characteristics of the mesh pattern and the spatial frequency characteristics of the pixel array pattern, from the obtained spatial frequency characteristics of the mesh pattern and the pixel array pattern;
determining a lowest frequency among the calculated frequencies of the moires, and comparing the spectral intensity of the moire of the lowest frequency with −3.6 expressed in terms of a common logarithm; and
setting the mesh pattern to be a mesh pattern of the conductive film when the spectral intensity of the moire of the lowest frequency defined by the common logarithm is equal to or less than −3.6, and when the spectral intensity of the moire of the lowest frequency is greater than −3.6, updating the transmittance period image data of the mesh pattern to transmittance period image data of a new mesh pattern, and repeating the respective steps of obtaining spatial frequency characteristics, calculating frequencies and spectral intensities of moires, and comparing the spectral intensity of the moire of the lowest frequency with −3.6 until the spectral intensity of the moire of the lowest frequency becomes equal to or less than −3.6.

18. The method for determining a mesh pattern of a conductive film according to claim 17, wherein
the mesh-like wiring has the mesh pattern including an electrode wiring pattern, which is formed of the plurality of thin metal wires in the form of a continuous mesh, and a non-electrode wiring pattern, which is formed of the plurality of thin metal wires in the form of a mesh, has a plurality of disconnection portions, and is discontinuous to and insulated from the electrode wiring pattern,
the transmittance period image data of the mesh pattern is transmittance period image data of the mesh pattern including the non-electrode wiring pattern having the plurality of disconnection portions, and
the spatial frequency characteristics of the mesh pattern is spatial frequency characteristics of the mesh pattern including the plurality of disconnection portions that are obtained at least when the mesh pattern is observed from a front side.

19. The method for determining a mesh pattern of a conductive film according to claim 18, wherein
the non-electrode wiring pattern is formed of the plurality of thin metal wires in the form of a mesh, within a region in which the electrode wiring pattern has not been formed.

20. The method for determining a mesh pattern of a conductive film according to claim 17, wherein
based on the obtained spatial frequency characteristics of the mesh pattern, spectral peaks of which the peak intensity is equal to or greater than −4.5 expressed in terms of a common logarithm are extracted from a plurality of spectral peaks of two-dimensional Fourier spectra of the transmittance period image data of the mesh pattern, and peak frequencies and peak intensities of all of the extracted spectral peaks are calculated;
based on the obtained spatial frequency characteristics of the pixel array pattern, spectral peaks of which the peak intensity is equal to or greater than −4.5 expressed in terms of a common logarithm are extracted from a plurality of spectral peaks of two-dimensional Fourier spectra of the transmittance period image data of the pixel array pattern, and peak frequencies and peak intensities of all of the extracted spectral peaks are calculated; and
the frequencies and the spectral intensities of the moires are calculated from the peak frequencies and the peak intensities of the mesh pattern calculated as above and from the peak frequencies and the peak intensities of the pixel array pattern calculated as above.

21. The method for determining a mesh pattern of a conductive film according to claim 20, wherein
as the frequency of the moire, a difference between the peak frequency of the mesh pattern and the peak frequency of the pixel array pattern is calculated, and
as the spectral intensity of the moire, a product of two pairs of vector intensities including the peak intensity of the mesh pattern and the peak intensity of the pixel array pattern is calculated.

22. A method for determining a mesh pattern of a conductive film according to claim 17, wherein
the frequency of the moire is equal to or less than 3 cycles/mm.

* * * * *